(12) United States Patent
Ando et al.

(10) Patent No.: US 8,062,825 B2
(45) Date of Patent: Nov. 22, 2011

(54) POSITIVE RESIST COMPOSITION AND RESIST PATTERN FORMING METHOD

(75) Inventors: Tomoyuki Ando, Kawasaki (JP); Takako Hirosaki, Kawasaki (JP)

(73) Assignee: Tokyo Ohka Kogyo Co., Ltd., Kawasaki-shi (JP)

(*) Notice: Subject to any disclaimer, the term of this patent is extended or adjusted under 35 U.S.C. 154(b) by 753 days.

(21) Appl. No.: 11/719,179

(22) PCT Filed: Nov. 28, 2005

(86) PCT No.: PCT/JP2005/021803
§ 371 (c)(1),
(2), (4) Date: May 11, 2007

(87) PCT Pub. No.: WO2006/059569
PCT Pub. Date: Jun. 8, 2006

(65) Prior Publication Data
US 2009/0075177 A1 Mar. 19, 2009

(30) Foreign Application Priority Data

Dec. 3, 2004 (JP) ................. 2004-351700
Dec. 3, 2004 (JP) ................. 2004-351702
Dec. 16, 2004 (JP) ................. 2004-364567

(51) Int. Cl.
*G03F 7/004* (2006.01)
(52) U.S. Cl. ............ 430/270.1; 430/905; 430/910
(58) Field of Classification Search ........ 430/270.1, 430/326, 905, 910
See application file for complete search history.

(56) References Cited

U.S. PATENT DOCUMENTS

| | | | |
|---|---|---|---|
| 6,106,993 A | 8/2000 | Watanabe et al. | |
| 6,143,460 A * | 11/2000 | Kobayashi et al. | 430/170 |
| 6,245,930 B1 | 6/2001 | Oomori et al. | |
| 6,280,898 B1 | 8/2001 | Hasegawa et al. | |
| 6,358,665 B1 * | 3/2002 | Pawlowski et al. | 430/270.1 |
| 6,465,150 B1 * | 10/2002 | Numata et al. | 430/270.1 |
| 6,479,211 B1 | 11/2002 | Sato et al. | |
| 6,627,381 B1 | 9/2003 | Uetani et al. | |
| 6,723,483 B1 * | 4/2004 | Oono et al. | 430/170 |
| 7,524,604 B2 * | 4/2009 | Hojo et al. | 430/270.1 |
| 2001/0026895 A1 | 10/2001 | Itoh et al. | |
| 2002/0090569 A1 | 7/2002 | Suzuki et al. | |
| 2003/0232273 A1 | 12/2003 | Adams et al. | |
| 2004/0166432 A1 * | 8/2004 | Ohsawa et al. | 430/170 |
| 2004/0170918 A1 | 9/2004 | Maesawa et al. | |
| 2005/0042541 A1 * | 2/2005 | Hagihara et al. | 430/270.1 |
| 2005/0130057 A1 | 6/2005 | Sudo et al. | |
| 2005/0158657 A1 | 7/2005 | Suzuki et al. | |
| 2006/0141386 A1 * | 6/2006 | Okui et al. | 430/270.1 |
| 2006/0251986 A1 * | 11/2006 | Sato et al. | 430/270.1 |
| 2008/0241747 A1 | 10/2008 | Hojo et al. | |

FOREIGN PATENT DOCUMENTS

| | | |
|---|---|---|
| EP | 1619554 A1 | 1/2006 |
| JP | 11072928 | 3/1999 |
| JP | 2000147773 | 5/2000 |
| JP | A-2000-241978 | 9/2000 |
| JP | A-2000-330284 | 11/2000 |
| JP | 2002031892 | 1/2002 |
| JP | A-2002-156759 | 5/2002 |
| JP | 2002341538 | 11/2002 |
| JP | 2002363146 | 12/2002 |
| JP | A-2003-295444 | 10/2003 |
| JP | 2004-333549 | 11/2004 |
| JP | 20044333549 | 11/2004 |
| JP | A-2005-234534 | 9/2005 |
| KR | 2000-77438 | 12/2000 |
| KR | 10-2004-0030687 | 4/2004 |
| KR | 10-2004-0088069 | 10/2004 |
| WO | WO 2004097524 A1 * | 11/2004 |

OTHER PUBLICATIONS

Office Action issued on the counterpart Korean Patent Application No. 10-2008-7025312, dated Jan. 7, 2009.
Isamu Tanabe, et al., "Lecture on Photomask Technology", Kogyo Chosakai Publishing Inc., First Edition, Aug. 26, 1996, pp. 10-19 (p. 10, lines 16 to 29).
International Search Report from PCT/JP2005/021803 dated Feb. 21, 2006.
Office Action issued Apr. 16, 2008 in Korean Patent Application No. 10-2007-7011254.
Decision to Grant a Patent issued on counterpart Korean Patent Application No. 10-2007-7011254, dated Mar. 18, 2009.
Office Action issued in counterpart Japanese Application No. JP 2004-351702, dated Mar. 30, 2010.
Office Action issued in counterpart Japanese Application No. JP 2004-364567, dated Mar. 30, 2010.
Office Action (Notice of Allowance) issued in counterpart Japanese Application No. JP 2004-364567, dated Jul. 13, 2010.

* cited by examiner

*Primary Examiner* — John S Chu
(74) *Attorney, Agent, or Firm* — Knobbe Martens Olson & Bear LLP

(57) ABSTRACT

A positive resist composition having excellent size controllability, and a resist pattern forming method are provided. This positive resist composition contains a resin component (A) comprising an alkali soluble constituent unit (a1) which comprises a constituent unit (a11) derived from (α-methyl) hydroxystyrene, and a constituent unit (a2) which has an acid dissociable dissolution inhibiting group including an acid dissociable dissolution inhibiting group (II) represented by the following general formula (II) and/or a specific chain acid dissociable dissolution inhibiting group (III); an acid generator component (B) which generates an acid upon exposure; and preferably contains an aromatic amine (C).

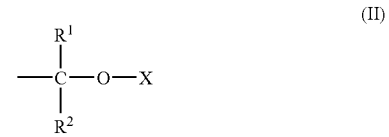

9 Claims, No Drawings

POSITIVE RESIST COMPOSITION AND RESIST PATTERN FORMING METHOD

RELATED APPLICATIONS

This application is the U.S. National Phase filing under 35 U.S.C. §371 of PCT/JP2005/021803, filed Nov. 28, 2005, which designated the United States and was published in a language other than English, which claims priority under 35 U.S.C. §119(a)-(d) to Japanese Patent Application No. 2004-351700, filed Dec. 3, 2004; Japanese Patent Application No. 2004-351702, filed Dec. 3, 2004; and Japanese Patent Application No. 2004-364567, filed Dec. 16, 2004. The content of these applications is incorporated herein by reference in their entireties.

TECHNICAL FIELD

The present invention relates to a positive resist composition and a resist pattern forming method.

BACKGROUND ART

A photolithography technology comprises the steps of forming a resist film made of a resist composition on a substrate, selectively exposing the resist film to radiation such as light or electron beam through a photomask having a predetermined pattern formed thereon, and subjecting the resist film to a development treatment to form a resist pattern having a predetermined shape on the resist film. A resist composition capable of being changing into characteristics wherein the exposed area is dissolved in a developing solution is referred to as a positive resist composition, while a resist composition capable of being changing into characteristics wherein the exposed area is not dissolved in a developing solution is referred to as a negative resist composition.

In the production of semiconductor devices and liquid crystal displays, rapid progress has recently been made in miniaturizing of a pattern with the progress of a lithography technology. As a technique for miniaturizing of the size, shortening of the wavelength of an exposure light source is generally performed. Specifically, while ultraviolet rays typified by g-ray and i-ray have hitherto been used, KrF excimer laser (248 nm) is now introduced and also ArF excimer laser (193 nm) having a shorter wavelength than that of the above excimer laser begins to be introduced. Also, a study about $F_2$ excimer (157 nm) laser having a shorter wavelength than that of these excimer lasers, EUV (Extreme Ultraviolet ray), electron beam and X-ray have been made. Exposure to electron beam or EUV is usually conducted by exposure through a desired mask pattern or direct drawing in vacuum.

To reproduce a pattern having a fine size, a resist material having high resolution is required. As the resist material, a chemically amplified resist composition containing a base resin and an acid generator which generates an acid upon exposure is used. For example, a positive chemically amplified photoresist contains a resin component in which alkali solubility enhances by an action of an acid, and an acid generator component which generates an acid upon exposure. When an acid is generated from an acid generator upon exposure in the case of forming a resist pattern, the exposed area becomes soluble in an alkali.

As the resin component of the positive resist composition, for example, a resin in which a portion of hydroxyl groups of a polyhydroxystyrene-based resin are protected with an acid dissociable dissolution inhibiting group, or a resin in which a portion of carboxy groups of an acrylic resin are protected with an acid dissociable dissolution inhibiting group is used. As the acid dissociable dissolution inhibiting group, a so-called acetal group, for example, a chain ether group such as 1-ethoxyethyl group or a cyclic ether group such as tetrahydropyranyl group, tertiary alkyl group such as tert-butyl group, and a tertiary alkoxycarbonyl group such as tert-butoxycarbonyl group are mainly used (see, for example, Japanese Unexamined Patent Application, First Publication No. 2002-341538).

On the other hand, the photomask used in the case of forming a pattern comprises a transparent substrate and a shielding layer formed thereon in the form of a predetermined pattern. Also in the case of producing such a photomask, a resist composition is used similar to the above case. That is, a shielding substrate material comprising a transparent substrate (glass substrate) and a shielding layer (chromium oxide layer) made mainly of chromium oxide formed on the transparent substrate is prepared, and a resist film is formed on the chromium oxide layer. Then, the resist film is selectively exposed through a resist for forming a photomask and developed to form a resist pattern on the chromium oxide layer. Then, the chromium oxide layer of the area, on which no pattern is formed, is etched through the resist pattern as a mask and the pattern is transferred onto the chromium oxide layer to obtain a photomask comprising a glass substrate and a chromium oxide layer having a predetermined pattern formed thereon (see, for example, written by Isamu TANABE et al., "Lecture on Photomask Technology", Kogyo Chosakai Publishing, Inc., First Edition, Aug. 20, 1996, pp. 10-19).

In the production of the photomask, the exposure is mainly conducted by direct drawing using electron beam because a fine pattern can be formed.

DISCLOSURE OF THE INVENTION

Problem to be Solved by the Invention

However, when the resist material described above is used in the formation of a resist pattern, particularly the formation of a resist pattern for the production of a photomask, particularly when drawing in vacuum, for example, direct drawing using electron beam is conducted, there arises a problem that, even if direct drawing is conducted on the same substrate surface under the same drawing conditions, the size of the objective pattern is different from that of a pattern to be formed, resulting in poor size controllability. The size controllability is most important characteristic in the production of the photomask and a larger influence is exerted on performances of the photomask as the pattern size decreases, and miniaturizing of the pattern size is very important in the production of a photomask having a 65 nm node or less.

Under these circumstances, the present invention has been made and object thereof is to provide a positive resist composition having excellent size controllability, particularly a positive resist composition for production of a photomask, and a resist pattern forming method.

Means for Solving the Problem

A first aspect of the present invention used to achieve the above object is a positive resist composition comprising a resin component (A) comprising an alkali soluble constituent unit (a1) and a constituent unit (a2) having an acid dissociable dissolution inhibiting group in which alkali solubility enhances by an action of an acid, and an acid generator component (B) which generates an acid upon exposure, wherein in the resin component (A), the constituent unit (a1) comprises a constituent unit (a11) derived from (α-methyl)hydroxystyrene, and the constituent unit (a2) has an acid dissociable dissolution inhibiting group (II) represented by the following general formula (II):

[Chemical Formula 1]

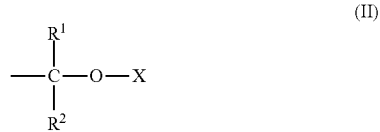

(II)

wherein X represents an aliphatic cyclic group, an aromatic cyclic hydrocarbon group or an alkyl group having 1 to 5 carbon atoms, $R^1$ represents an alkyl group having 1 to 5 carbon atoms, or X and $R^1$ each independently represents an alkylene group having 1 to 5 carbon atoms and the end of X is bonded with the end of $R^1$, and $R^2$ represents an alkyl group having 1 to 5 carbon atoms or a hydrogen atom, and/or at least one acid dissociable dissolution inhibiting group (III) selected from the group consisting of a chain tertiary alkoxycarbonyl group, a chain tertiary alkyl group and a chain tertiary alkoxycarbonylalkyl group, the positive resist composition further comprising an aromatic amine (C).

A second aspect of the present invention is a resist pattern forming method comprising the steps of forming a resist film on a substrate using the positive resist composition of the first aspect, selectively exposing the resist film, and developing the resist film with an alkali to form a resist pattern.

A third aspect of the present invention is a positive resist composition for production of a photomask, comprising a resin component (A) comprising an alkali soluble constituent unit (a1) and a constituent unit (a2) having an acid dissociable dissolution inhibiting group in which alkali solubility enhances by an action of an acid, and an acid generator component (B) which generates an acid upon exposure, wherein the constituent unit (a1) comprises a constituent unit (a11) derived from α-methyl)hydroxystyrene, and the constituent unit (a2) has an acid dissociable dissolution inhibiting group (II) represented by the above formula (II), and at least one acid dissociable dissolution inhibiting group (III) selected from the group consisting of a chain tertiary alkoxycarbonyl group, a chain tertiary alkyl group and a chain tertiary alkoxycarbonylalkyl group.

A fourth aspect of the present invention is a resist pattern forming method comprising forming a resist film on a glass substrate, on which a chromium oxide layer is laminated, using the positive resist composition for production of a photomask of the first aspect, selectively exposing the resist film, and subjecting the resist film to a heat treatment (post exposure baking) and a development treatment to form a resist pattern.

A fifth aspect of the present invention is a positive resist composition comprising a resin component (A) comprising an alkali soluble constituent unit (a1) and a constituent unit (a2) having an acid dissociable dissolution inhibiting group in which alkali solubility enhances by an action of an acid, and an acid generator component (B) which generates an acid upon exposure, wherein the constituent unit (a1) comprises a constituent unit (a11) derived from α-methyl)hydroxystyrene and a constituent unit (a12) derived from an (α-lower alkyl)acrylate ester having an alcoholic hydroxyl group, and the constituent unit (a2) comprises a constituent unit (a21) in which hydrogen atoms of a hydroxyl group of the constituent unit (a11) are substituted with an acid dissociable dissolution inhibiting group and/or a constituent unit (a22) in which hydrogen atoms of an alcoholic hydroxyl group of the constituent unit (a12) are substituted with an acid dissociable dissolution inhibiting group, and the acid dissociable dissolution inhibiting group includes an acid dissociable dissolution inhibiting group (II) represented by the above general formula (II), and an acid dissociable dissolution inhibiting group (III) as at least one kind selected from the group consisting of a chain tertiary alkoxycarbonyl group, a chain tertiary alkyl group and a chain tertiary alkoxycarbonylalkyl group.

A sixth aspect of the present invention is a resist pattern forming method comprising the steps of forming a resist film on a substrate using the positive resist composition of the first aspect, selectively exposing the resist film, and developing the resist film with an alkali to form a resist pattern.

In the present specification and claims, "constituent unit" means a monomer unit constituting a polymer.

"Exposure" has a concept including entire irradiation with radiation, and also includes irradiation with electron beam.

According to the present invention, a positive resist composition having excellent size controllability, and a resist pattern forming method can be provided.

BEST MODE FOR CARRYING OUT THE INVENTION

<Positive Resist Composition>

The positive resist composition of the present invention comprises a resin component (A) comprising an alkali soluble constituent unit (a1) and a constituent unit (a2) having an acid dissociable dissolution inhibiting group in which alkali solubility enhances by an action of an acid (hereinafter sometimes referred to as a component (A)), and an acid generator component (B) which generates an acid upon exposure (hereinafter sometimes referred to as a component (B)).

In the component (A), when the acid generated from the component (B) upon exposure reacts, the acid dissociable dissolution inhibiting group is dissociated and the entire resin component (A) becomes soluble in an alkali from insoluble in an alkali.

Therefore, when selective exposure is conducted through a mask pattern, or selective exposure is conducted through no mask pattern, or direct drawing is conducted in the formation of a resist pattern, or post exposure baking (PEB) is conducted in addition to the exposure or drawing, the exposed area becomes soluble in an alkali, while the unexposed area remains alkali-insoluble, and thus a positive resist pattern can be formed by developing with an alkali.

[Component (A)]
Constituent Unit (a1)

In the component (A), an alkali soluble constituent unit (a1) means a constituent unit having a polar group such as hydroxyl group or carboxy group therein, a monomer, from which the constituent unit is derived, being soluble in an alkali such as alkali developing solution.

In the present invention, it is necessary that the constituent unit (a1) comprises the following constituent unit (a11). By a combination of the constituent unit (a11) and a constituent unit (a2) having acid dissociable dissolution inhibiting groups (II) and/or (III), preferably (II) and (III), size controllability is improved. Dry etching resistance is improved by comprising the constituent unit (a11). Furthermore, there is a merit that α-methyl)hydroxystyrene as a material is easily available and has low price.

The constituent unit (a11) is a constituent unit derived from α-methyl)hydroxystyrene.

As used herein, (α-methyl)hydroxystyrene means one or both of hydroxystyrene and α-methylhydroxystyrene. "α-methylhydroxystyrene" means those in which hydrogen atoms bonded to a carbon atom of hydroxystyrene are substituted with a methyl group. "Constituent unit derived from (α-methyl)styrene" means a constituent unit formed by cleavage of an ethylenical double bond of (α-methyl)styrene.

The constituent unit (a11) includes, for example, a constituent unit represented by the following general formula:

[Chemical Formula 2]

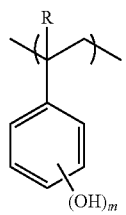

(I)

wherein R represents hydrogen atom or a methyl group, and m represents an integer of 1 to 3.

In the general formula (I), R is a hydrogen atom or a methyl group, and preferably a hydrogen atom.

m is an integer of 1 to 3, and preferably 1.

When m is 1, the position of a hydroxyl group may be any of o-position, m-position, and p-position, but is preferably the p-position because of easy availability and low cost. Furthermore, when m is 2 or 3, any substitution positions can be combined.

In the present invention, the constituent unit (a1) further comprises a constituent unit (a12) derived from an (α-lower alkyl)acrylate ester having an alcoholic hydroxyl group.

Such a constituent unit (a12) has lower solubility in an alkali developing solution than that of the constituent unit (a11). Therefore, when the component (A) comprises the constituent unit (a12), solubility of the component (A) in the alkali developing solution, in the state where the acid dissociable dissolution inhibiting group is dissociated, is lower than that in the case of having only the constituent unit (a11) as the constituent unit (a1). Therefore, even if the proportion of the constituent unit (a2) having an acid dissociable dissolution inhibiting group is lower than that in the case of having only the constituent unit (a11) as the constituent unit (a1), sufficient insolubility in the alkali developing solution can be obtained and thickness loss after the development can be reduced.

Accordingly, as long as the constituent unit (a12) has such an action, the constituent unit may be any constituent unit derived from an (α-lower alkyl)acrylate ester having an alcoholic hydroxyl group.

As used herein, "(α-lower alkyl)acrylate ester" means one or both of a α-lower alkylacrylate ester such as methacrylate ester, and an acrylate ester. "α-lower alkylacrylate ester" means those wherein hydrogen atoms bonded to a carbon atoms of an acrylate ester are substituted with a lower alkyl group. "Constituent unit derived from an (α-lower alkylacrylate ester" means a constituent unit formed by cleavage of an ethylenical double bond of the (α-lower alkyl)acrylate ester.

The lower alkyl group bonded to a carbon atoms of the α-lower alkylacrylate ester is preferably a linear or branched alkyl group having 1 to 5 carbon atoms, and examples thereof include methyl group, ethyl group, propyl group, isopropyl group, n-butyl group, isobutyl group, tert-butyl group, pentyl group, isopentyl group, and neopentyl group. From an industrial point of view, a methyl group is preferable.

The constituent unit (a12) is preferably a constituent unit derived from an aliphatic polycyclic group-containing (α-lower alkyl)acrylate ester having an alcoholic hydroxyl group. Since the constituent unit has an aliphatic polycyclic group, an improvement in etching resistance and reduction of thickness loss after etching are expected. Also, resolution is excellent. "Aliphatic" means a group or compound having no aromaticity as described hereinafter.

The polycyclic group constituting the aliphatic polycyclic group having an alcoholic hydroxyl group includes, for example, a group wherein one hydrogen group is eliminated from bicycloalkane, tricycloalkane or tetracycloalkane. Specifically, the polycyclic group is a group wherein one hydrogen group is eliminated from polycycloalkane such as adamantane, norbornane, isobornane, tricyclodecane, or tetracyclododecane. Such a polycyclic group can be appropriately selected from a lot of groups proposed in an ArF resist when used. Among these groups, an adamantyl group, a norbornyl group and a tetracyclododecanyl group are preferable from an industrial point of view.

The constituent unit (a12) is particularly preferably a constituent unit derived from an adamantyl group-containing (α-lower alkyl)acrylate ester having an alcoholic hydroxyl group, which is represented by the following general formula (IV).

The constituent unit represented by the general formula (IV) is most preferably a constituent unit represented by the following general formula (IVa):

[Chemical Formula 3]

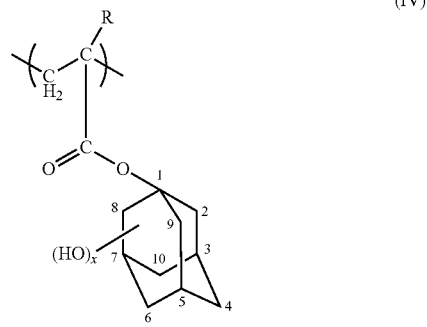

(IV)

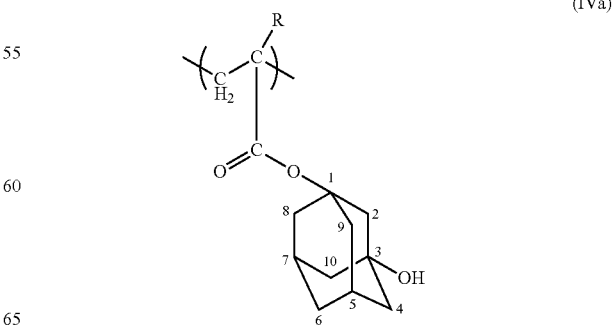

(IVa)

wherein R represents a hydrogen atom or a lower alkyl group, and x represents an integer of 1 to 3.

In the present invention, the constituent unit (a1) may comprise a constituent unit other than the constituent unit (a11) and the constituent unit (a12). Such a constituent unit includes a constituent unit derived from (meth)acrylic acid. Also, "(meth)acrylic acid" means one or both of methacrylic acid and acrylic acid. Also, "constituent unit derived from (meth)acrylic acid" means a constituent unit formed by cleavage of an ethylenical double bond of (meth)acrylic acid.

In the component (A), the proportion of the constituent unit (a1) is preferably from 50 to 95 mol %, more preferably from 60 to 85 mol %, and most preferably from 65 to 80 mol %, based on the entire constituent unit constituting the component (A). Thus, proper alkali solubility can be obtained.

Constituent Unit (a2)

The constituent unit (a2) is a constituent unit having an acid dissociable dissolution inhibiting group.

In the present invention, it is necessary to have, as the acid dissociable dissolution inhibiting group, an acid dissociable dissolution inhibiting group (II) and/or an acid dissociable dissolution inhibiting group (III). The constituent unit (a2) may have at least one of an acid dissociable dissolution inhibiting group (II) and an acid dissociable dissolution inhibiting group (III), preferably at least an acid dissociable dissolution inhibiting group (II) in view of the effects of the present invention, and more preferably both an acid dissociable dissolution inhibiting group (II) and an acid dissociable dissolution inhibiting group (III) because of excellent PED (Post Exposure Delay) stability in vacuum.

The acid dissociable dissolution inhibiting group (II) is a group represented by the above general formula (II).

In the formula (II), X represents an aliphatic cyclic group, an aromatic cyclic hydrocarbon group or an alkyl group having 1 to 5 carbon atoms.

As used herein, "aliphatic" is a relative concept to an aromatic and is defined as a group or compound having no aromaticity. "Aliphatic cyclic group" means a monocyclic or polycyclic group having no aromaticity. At this time, the "aliphatic cyclic group" is not limited to a group composed of carbon and hydrogen (hydrocarbon group), but is preferably a hydrocarbon group. Also, "hydrocarbon group" may be saturated or unsaturated, but is preferably saturated. It is preferably a polycyclic group.

Such an aliphatic cyclic group can be appropriately selected from a lot of groups proposed in a conventional ArF resist when used. Specific examples of the aliphatic cyclic group include aliphatic monocyclic group having 5 to 7 carbon atoms and aliphatic polycyclic group having 10 to 16 carbon atoms. The aliphatic monocyclic group having 5 to 7 carbon atoms includes, for example, a group wherein one hydrogen atom is eliminated from monocycloalkane, and is specifically a group wherein one hydrogen atom is eliminated from cyclopentane or cyclohexane. The aliphatic polycyclic group having 10 to 16 carbon atoms includes, for example, a group wherein one hydrogen atom is eliminated from bicycloalkane, tricycloalkane or tetracycloalkane, and is specifically a group in which one hydrogen atom is eliminate from polycycloalkane such as adamantane, norbornane, isobornane, tricyclodecane, or tetracyclododecane. Among these groups, an adamantyl group, a norbornyl group and a tetracyclododecanyl group are preferable from an industrial point of view, and an adamantyl group is particularly preferable.

The aromatic cyclic hydrocarbon group of X includes, for example, an aromatic polycyclic group having 10 to 16 carbon atoms, and is specifically a group wherein one hydrogen atom is eliminated from naphthalene, anthracene, phenanthrene, or pyrene. Specific examples thereof include 1-naphthyl group, 2-naphthyl group, 1-anthracenyl group, 2-anthracenyl group, 1-phenanthryl group, 2-phenanthryl group, 3-phenanthryl group, and 1-pyrenyl group, and a 2-naphthyl group is particularly preferable from an industrial point of view.

The alkyl group of X may be linear or branched. Specific examples thereof include methyl group, ethyl group, propyl group, isopropyl group, n-butyl group, isobutyl group, tert-butyl group, pentyl group, isopentyl group, and neopentyl group. A methyl group or an ethyl group is preferably from an industrial point of view, and a methyl group is particularly preferable.

X is preferably an aliphatic polycyclic group. When X is an aliphatic polycyclic group, line edge roughness and rectangularity of profile of a resist pattern are improved. Also, etching resistance is improved.

When the constituent unit (a2) comprises a constituent unit (a22) described hereinafter, X is preferably an alkyl group having 1 to 5 carbon atoms in view of ease of synthesis.

In the formula (II), $R^1$ represents an alkyl group having 1 to 5 carbon atoms, and may be linear or branched. Specific examples thereof include methyl group, ethyl group, propyl group, isopropyl group, n-butyl group, isobutyl group, tert-butyl group, pentyl group, isopentyl group, and neopentyl group. A methyl group or an ethyl group is preferable from an industrial point of view, and a methyl group is particularly preferable.

$R^2$ represents an alkyl group having 1 to 5 carbon atoms or a hydrogen atom. Examples of the alkyl group include the same alkyl group as that of $R^1$. $R^2$ is preferably a hydrogen atom from an industrial point of view.

In the formula (II), X and $R^1$ each independently represent an alkylene group having 1 to 5 carbon atoms and the end of X may be bonded with the end of $R^1$.

In this case, in the formula (II), a cyclic group is formed of $R^1$, X, an oxygen atom bonded with X, and a carbon atom bonded with the oxygen atom and $R^1$. The cyclic group is preferably a 4- to 7-membered ring, and more preferably a 4- to 6-membered ring. Specific examples of the cyclic group include tetrahydropyranyl group and tetrahydrofuranyl group.

Because of excellent effects of the present invention, the acid dissociable dissolution inhibiting group (II) is particularly preferably an acid dissociable dissolution inhibiting group represented by the following general formula (II-1):

[Chemical Formula 4]

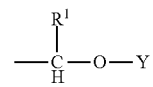

(II-1)

wherein Y represents an aliphatic cyclic group, an aromatic cyclic hydrocarbon group or an alkyl group having 1 to 5 carbon atoms, and $R^1$ represents an alkyl group having 1 to 5 carbon atoms.

The alkyl group having 1 to 5 carbon atoms of $R^1$ is the same as that in the general formula (II).

The aliphatic cyclic group, aromatic cyclic hydrocarbon group or alkyl group having 1 to 5 carbon atoms of Y are the same as those of X in the general formula (II).

Specific examples of the acid dissociable dissolution inhibiting group represented by the general formula (II-1) include 1-methoxyethyl group, 1-ethoxyethyl group, 1-iso-propoxyethyl group, 1-n-butoxyethyl group, 1-tert-butoxyethyl group, 1-methoxypropyl group, 1-ethoxypropyl group, 1-isopropoxypropyl group, 1-n-butoxypropyl group, and 1-tert-butoxypropyl group in the case of a group wherein Y is an alkyl group, that is, a 1-alkoxyalkyl group. A group wherein Y is an aliphatic cyclic group includes 1-cyclohexyloxyethyl group, 1-(2-adamantyl)oxyethyl group, and 1-(1-adamantyl) oxyethyl group represented by the following formula (II-a). A group wherein Y is an aromatic cyclic hydrocarbon group includes a 1-(2-naphthyl)oxyethyl group represented by the following formula (II-b).

Among these groups, a 1-ethoxyethyl group or a 1-(1-adamantyl)oxyethyl group is preferable.

[Chemical Formula 5]

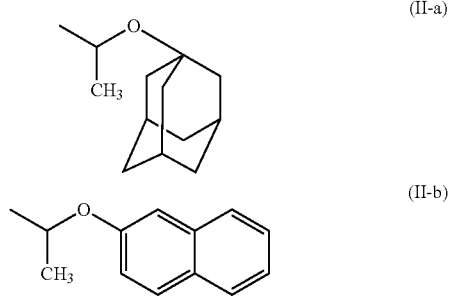

The acid dissociable dissolution inhibiting group (III) is at least one selected from the group consisting of chain tertiary alkoxycarbonyl group, chain tertiary alkyl group, and chain tertiary alkoxycarbonylalkyl group.

The number of carbon atoms of a chain tertiary alkoxy group and/or a chain tertiary alkyl group included in the acid dissociable dissolution inhibiting group (III) is preferably from 4 to 10, and more preferably from 4 to 8. The total number of carbon atoms of the acid dissociable dissolution inhibiting group (III) is preferably from 4 to 10, and more preferably from 4 to 8.

Examples of the chain tertiary alkoxycarbonyl group include tert-butoxycarbonyl group and tert-amyloxycarbonyl group.

Examples of the chain tertiary alkyl group include tert-butyl group and tert-amyl group.

Examples of the chain tertiary alkoxycarbonylalkyl group include tert-butoxycarbonylmethyl group and tert-amyloxycarbonylmethyl group.

Among these groups, a chain tertiary alkoxycarbonyl group is preferable and a tert-butoxycarbonyl group is most preferable because resist pattern shape is improved.

If necessary, the constituent unit (a2) may comprise a constituent unit having an acid dissociable dissolution inhibiting group other than the acid dissociable dissolution inhibiting groups (II) and (III).

As the acid dissociable dissolution inhibiting group other than the acid dissociable dissolution inhibiting groups (II) and (III), a conventionally known acid dissociable dissolution inhibiting group can be used. As the conventionally known acid dissociable dissolution inhibiting group, for example, it is possible to appropriately use those proposed as the acid dissociable dissolution inhibiting group in a chemically amplified positive resist composition for KrF and a chemically amplified positive resist composition for ArF, and the acid dissociable dissolution inhibiting group includes, for example, a monocyclic or polycyclic aliphatic hydrocarbon group containing a tertiary carbon atom on the ring, such as 1-methylcyclopentyl group, 1-ethylcyclopentyl group, 1-methylcyclohexyl group, 1-ethylcyclohexyl group, 2-methyl-2-adamantyl group, or 2-ethyl-2-adamantyl group.

Examples of the constituent unit (a2) include a constituent unit (a21) in which the hydrogen atom of a hydroxyl group of the constituent unit (a11) is substituted with an acid dissociable dissolution inhibiting group, a constituent unit (a22) in which the hydrogen atom of an alcoholic hydroxyl group of the constituent unit (a12) is substituted with an acid dissociable dissolution inhibiting group, and a constituent unit in which hydrogen atoms of a carboxyl group of a constituent unit derived from (meth)acrylic acid are substituted with an acid dissociable dissolution inhibiting group. It is preferable to have a constituent unit (a21) and/or a constituent unit (a22) among these constituent units In the component (A), the proportion of the constituent unit (a2) is preferably from 5 to 45 mol %, more preferably from 10 to 45 mol %, still more preferably from 15 to 40 mol %, and most preferably from 20 to 35 mol %, based on the entire constituent unit constituting the component (A). Thus, it is possible to sufficiently secure alkali insolubility in the unexposed area of a resist film in the case of forming a resist pattern.

In sixth and seventh aspects of the present invention, a ratio (molar ratio) of the total proportion of a constituent unit (a11) and a constituent unit (a21) (hydroxystyrene-based constituent unit) to the total proportion of a constituent unit (a12) and a constituent unit (a22) ((α-lower alkyl)acrylate ester-based constituent unit) in the component (A) is preferably within a range from 95:5 to 50:50, more preferably from 95:5 to 60:40, and still more preferably from 85:15 to 70:30. When the ratio is within the above range, solubility in a developing solution can be sufficiently secured.

A ratio (molar ratio) of the total proportion of a constituent unit (a11) and a constituent unit (a21) (hydroxystyrene-based constituent unit) to the total proportion of a constituent unit (a12) and a constituent unit (a22) ((α-lower alkyl)acrylate ester-based constituent unit) in the component (A) is preferably within a range from 9:1 to 1:9, more preferably from 8:2 to 2:8, and still more preferably from 8:2 to 5:5. When the ratio is within the above range, solubility in a developing solution can be sufficiently secured.

The component (A) may comprise a constituent unit (a3) derived from (α-methyl)styrene, in addition to the constituent units (a1) and (a2).

In the present invention, although the constituent unit (a3) is not essential, there can be obtained merits such as improvement in depth of focus and improvement in dry etching resistance by comprising the constituent unit.

As used herein, "(α-methyl)styrene" means one or both of styrene and α-methylstyrene. "α-methylstyrene" means those in which hydrogen atoms bonded to a carbon atom of hydroxystyrene are substituted with a methyl group. "Constituent unit derived from (α-methyl)styrene" means a constituent unit formed by cleavage of an ethylenical double bond of (α-methyl)styrene. In (α-methyl)styrene, hydrogen atoms of a phenyl group may be substituted with a substituent such as alkyl group having 1 to 5 carbon atoms.

The constituent unit (a3) includes a constituent unit represented by the following general formula (III):

[Chemical Formula 6]

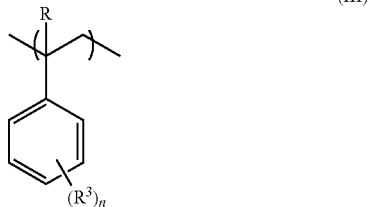

(III)

wherein R represents a hydrogen atom or a methyl group, $R^3$ represents an alkyl group having 1 to 5 carbon atoms, and n represents an integer of 0 or 1 to 3.

In the formula (III), $R^3$ represents a linear or branched alkyl group carbon atoms having 1 to 5 carbon atoms, and examples thereof include methyl group, ethyl group, propyl group, isopropyl group, n-butyl group, isobutyl group, tert-butyl group, pentyl group, isopentyl group, and neopentyl group. From an industrially point of view, a methyl group or an ethyl group is preferable.

n is 0 or an integer of 1 to 3. n is preferably 0 or 1, and particularly preferably 0 from an industrial point of view.

When n is 1 to 3, the substitution position of $R^3$ may be any of o-position, m-position, and p-position. Furthermore, when n is 2 or 3, any substitution positions can be combined.

When the component (A) comprises a constituent unit (a3), the proportion of the constituent unit (a3) is preferably from 0.5 to 25 mol %, and more preferably from 3 to 20 mol %, based on the entire constituent unit constituting the component (A). When the proportion of the constituent unit (a3) is more than the above range, solubility in a developing solution tends to deteriorate.

A weight average molecular weight (polystyrene equivalent weight average molecular weight determined using gel permeation chromatography (GPC), the same shall apply hereinafter) of the component (A) is preferably from 3,500 to 33,000, and more preferably from 5,500 to 23,000.

In first to fourth aspects of the present invention, the weight average molecular weight, in the state where all acid dissociable dissolution inhibiting groups are dissociated, is preferably from 2,000 to 30,000, and more preferably from 4,000 to 20,000. By adjusting the weight average molecular weight, in the state where all acid dissociable dissolution inhibiting groups are dissociated, to 30,000 or less, solubility in a resist solvent can be sufficiently secured. By adjusting the weight average molecular weight to 2,000 or more, dry etching resistance of the resulting resist pattern is improved and thickness loss is improved. As the weight average molecular weight increases within the above range, thickness loss after etching is reduced.

In fifth and sixth aspects of the present invention, weight average molecular weight (polystyrene equivalent weight average molecular weight determine using gel permeation chromatography (GPC), the same shall apply hereinafter) of the component (A) is preferably from 3,500 to 33,000, and more preferably from 5,500 to 23,000.

By adjusting the weight average molecular weight to 33,000 or less, solubility in a resist solvent can be sufficiently secured. By adjusting the weight average molecular weight to 3,500 or more, dry etching resistance of the resulting resist pattern is improved and thickness loss is improved. As the weight average molecular weight increases within the above range, thickness loss after etching is reduced.

As the dispersity of the component (A) (Mw/Mn (number average molecular weight)) decreases (closer to monodisperse), resolution becomes more excellent and therefore it is preferable. The dispersity is preferably 2.0 or less, and more preferably 1.7 or less.

In the present invention, the component (A) preferably contains a copolymer comprising the constituent unit (a11), the constituent unit (a12), the constituent unit (a21) and/or the constituent unit (a22) (hereinafter sometimes referred to as a copolymer (A-1)). Thus, good resolution is obtained and development defects decrease. Also, good depth of focus is obtained.

The copolymer (A-1) may further comprise the above constituent unit (a3).

The copolymer (A-1) can be produced, for example, by a method comprising polymerizing a monomer corresponding to a constituent unit (a11) and a monomer corresponding to a constituent unit (a12), and substituting a portion of hydrogen atoms of a hydroxyl group of a constituent unit (a11) and a constituent unit (a12) with an acid dissociable dissolution inhibiting group using a known technique, thereby forming a constituent unit (a21) and/or a constituent unit (a22).

Alternatively, the polymer can be produced by a method comprising preparing a monomer corresponding to a constituent unit (a21) and a monomer corresponding to a constituent unit (a22), polymerizing these monomers using a conventional method, dissociating an acid dissociable dissolution inhibiting group through hydrolysis, thereby forming a constituent unit (a11) and a constituent unit (a2), and optionally substituting hydrogen atoms of a hydroxyl group of the constituent unit (a11) and/or the constituent unit (a12) with an acid dissociable dissolution inhibiting group using a known technique thereby forming a constituent unit (a21) and/or a constituent unit (a22).

In the present invention, it is preferable that the component (A) contains a polymer (A1) which comprises the constituent unit (a1) and the constituent unit (a2), and also has the acid dissociable dissolution inhibiting group (II) and does not have the acid dissociable dissolution inhibiting group (III) as the acid dissociable dissolution inhibiting group, and a polymer (A2) which comprises the constituent unit (a1) and the constituent unit (a2), and also has the acid dissociable dissolution inhibiting group (III) and does not have the acid dissociable dissolution inhibiting group (II) as the acid dissociable dissolution inhibiting group. By using such a mixture as the component (A), a resist pattern having good rectangular shape can be obtained. In sixth and seventh aspects, particularly excellent isolated line pattern can be obtained. As compared with the case where the same polymer has the acid dissociable dissolution inhibiting group (II) and the acid dissociable dissolution inhibiting group (III), it is easy to produce in the case where different polymers have these acid dissociable dissolution inhibiting groups and are mixed to form a mixed resin.

In the present invention, it is preferable that the polymer (A1) is the following polymer (A11) ad the polymer (A2) is the following polymer (A21). Also, it is preferable that the polymer (A1) is the following polymer (A12) and the polymer (A2) is the following polymer (A21).

Polymer (A11): Polymer which comprises the constituent unit (a11) and the constituent unit (a21), and also comprises neither the constituent unit (a12) nor the constituent unit (a22) (which has an acid dissociable dissolution inhibiting group (II) and does not have the acid dissociable dissolution inhibiting group (III))

Polymer (A12): Polymer which comprises a constituent unit (a11), the constituent unit (a12), the constituent unit (a21) and/or the constituent unit (a22) (which has an acid dissociable dissolution inhibiting group (II) and does not have the acid dissociable dissolution inhibiting group (III))

Polymer (A21): Polymer which comprises the constituent unit (a11) and the constituent unit (a21), and also comprises neither the constituent unit (a12) nor the constituent unit (a22) (which has an acid dissociable dissolution inhibiting group (III) and does not have the acid dissociable dissolution inhibiting group (II))

In the polymer (A11), the constituent unit (a11), and the constituent unit (a21) in the state where the acid dissociable dissolution inhibiting group is dissociated, that is, in the case where the acid dissociable dissolution inhibiting group is substituted with a hydrogen atom may be the same or different. For example, groups bonded to the carbon atoms at the α-position of hydroxystyrene may be the same (both groups are hydrogen atoms or methyl groups) or different (one group is a hydrogen atom and the other group is a methyl group). In view of control of alkali solubility, both groups are preferably hydrogen atoms.

In the polymer (A11), the proportion of the constituent unit (a11) is preferably from 50 to 95 mol %, more preferably from 55 to 85 mol %, and still preferably from 55 to 75 mol %, based on the total proportion of the entire constituent unit constituting the polymer (A11) in view of resolution and balance with the constituent unit (a21).

The proportion of the constituent unit (a21) is preferably from 5 to 50 mol %, more preferably from 10 to 45 mol %, and still more preferably from 15 to 45 mol %, based on the total proportion of the entire constituent unit constituting the polymer (A 1). When the polymer (A11) does not comprise the constituent unit (a3), the proportion is more preferably from 20 to 45 mol %. When the polymer comprises the constituent unit (a3), the proportion is more preferably from 10 to 20 mol %. By adjusting the proportion of the constituent unit (a21) to the lower limit or more within the above range, good contrast is obtained. By adjusting the proportion of the constituent unit to the upper limit or less within the above range, the effect of preventing development defects can be obtained.

The polymer (A11) preferably comprises, in addition to the constituent units (a11) and (a21), a constituent unit (a3). Although the constituent unit (a3) is not essential, there can be obtained merits such as improvement in depth of focus and improvement in dry etching resistance by comprising the constituent unit.

When the polymer comprises the constituent unit (a3), the proportion of the constituent unit (a3) in the polymer (A11) is preferably from 0.5 to 10 mol %, and more preferably from 2 to 5 mol %, based on the total proportion of the entire constituent unit constituting the polymer (A11). When the proportion of the constituent unit (a3) is more than the above range, solubility in a developing solution tends to deteriorate.

In the polymer (A11), the acid dissociable dissolution inhibiting group (II) is preferably a group wherein X in the formula (II) is an adamantyl group or a naphthyl group. Specific examples thereof include 1-(1-adamantyl)oxyethyl group represented by the formula (II-a) and 1-(2-naphthyl) oxyethyl group represented by the formula (II-b).

The polymer (A11) may be used alone, or a mixture of two or more kinds of polymers may be used.

When a mixture of two or more kinds of polymers is used as the polymer (A1), any two or more kinds of polymers selected from a polymer which comprises a constituent unit (a11) and a constituent unit (a21) and also does not have a constituent unit (a3), and a polymer which comprises a constituent unit (a11), a constituent unit (a21) and a constituent unit (a3) can be used in combination. That is, polymers having different weight average molecular weights and polymers having different proportions of each constituent unit can be optionally mixed when used. Such a mixture includes a mixture of a polymer which comprises a constituent unit (a11) and a constituent unit (a21) and also does not have a constituent unit (a3), and a polymer which comprises a constituent unit (a11), a constituent unit (a21) and a constituent unit (a3). By using such a mixture as the polymer (A1), a resist pattern having good rectangular shape and being an excellent isolated line can be obtained.

The weight average molecular weight of the polymer (A11) is preferably from 2,000 to 30,000, and more preferably from 5,000 to 20,000. By adjusting the weight average molecular weight to 30,000 or less, solubility in a resist solvent can be improved. By adjusting the weight average molecular weight to 2,000 or more, dry etching resistance of the resulting resist pattern is improved and thickness loss is improved. Also, good resist pattern shape can be obtained.

A monodisperse polymer (A11) having a small dispersity (ratio Mw/Mn) is preferable because of excellent resolution. Specifically, the dispersity is preferably 2.0 or less, and more preferably 1.7 or less.

The polymer (A11) can be produced, for example, by a method comprising polymerizing a monomer corresponding to a constituent unit (a11), and protecting a portion of hydrogen atoms of a hydroxyl group of the constituent unit (a11) with acid dissociable dissolution inhibiting group (including an acid dissociable dissolution inhibiting group (II)) using a known technique, thereby forming a constituent unit (a21).

Alternatively, the polymer (A11) can be produced by a method comprising preliminarily preparing a monomer corresponding to a constituent unit (a21), polymerizing the monomer using a conventional method, converting a portion of hydrogen atoms of a hydroxyl group protected with an acid dissociable dissolution inhibiting group into hydrogen atoms through hydrolysis, thereby forming a constituent unit (a11).

The polymer (A12) is a polymer comprising a constituent unit (a11), a constituent unit (a12), and at least one of a constituent unit (a21) and a constituent unit (a22).

The polymer may comprise either a constituent unit (a21) or a constituent unit (a22). The polymer preferably comprises only a constituent unit (a11), or both of constituent units (a21) and (a22).

When the polymer (A12) comprises a constituent unit (a21), in the polymer (A12), the constituent unit (a11) and the constituent unit (a21) in the state where the acid dissociable dissolution inhibiting group is dissociated, that is, in the case where the acid dissociable dissolution inhibiting group is substituted with a hydrogen atom may be the same or different, similar to the polymer (A11). For example, groups bonded to the carbon atoms at the α-position of hydroxystyrene may be the same (both groups are hydrogen atoms or methyl groups) or different (one group is a hydrogen atom and the other group is a methyl group). In view of control of alkali solubility, both groups are preferably hydrogen atoms.

When the polymer (A12) comprises a constituent unit (a22), the constituent unit (a12) and the constituent unit (a22) in the state where the acid dissociable dissolution inhibiting group is dissociated, that is, in the case where the acid dissociable dissolution inhibiting group is substituted with a hydrogen atom may be the same or different. For example, the constituent unit (a12) and the constituent unit (a22) may be a constituent unit derived from an acrylate ester or a constituent unit derived from a methacrylate ester, and also the structure of an aliphatic polycyclic group having an alcoholic hydroxyl group may be the same or different. In view of control of alkali solubility, both constituent units (a12) and (a22) are preferably constituent units derived from an acrylate ester.

In the copolymer (A12), an acid dissociable dissolution inhibiting group (II) is preferably a group wherein Y in the formula (II-1) is an alkyl group, that is, a 1-alkoxyalkyl group.

In the polymer (A12), the proportion of the total proportion of a constituent unit (a21) and a constituent unit (a22) based on the total proportion of a constituent unit (a11), a constituent unit (a12), a constituent unit (a21) and a constituent unit (a22), that is, the protection rate of a hydroxyl group in the copolymer (A-1) (the proportion of hydrogen atoms of a hydroxyl group, substituted with an acid dissociable dissolution inhibiting group) is preferably from 10 to 35 mol %, more preferably from 15 to 30 mol %, and still more preferably from 20 to 30 mol %. By adjusting the proportion to the upper limit or less within the above range, pattern defects (development defects) of a resist pattern after the development can be effectively prevented. On the other hand, by adjusting the proportion to the lower limit or more within the above range, etching resistance is improved and thickness loss is reduced. Also, deterioration of resolution performance can be suppressed. Also, as the protection rate of the hydroxyl group increases, thickness loss after the development can be more reduced.

In the polymer (A12), a ratio (molar ratio) of the total proportion of a constituent unit (a11) and a constituent unit (a21) (hydroxystyrene-based constituent unit) to the total proportion of a constituent unit (a12) and a constituent unit (a22) ((α-lower alkyl)acrylate ester-based constituent unit) is preferably within a range from 95:5 to 50:50, more preferably from 95:5 to 60:40, and still more preferably from 85:15 to 70:30. By adjusting the ratio within the above range, solubility in a developing solution can be sufficiently secured.

In the polymer (A12), the total proportion of a constituent unit (a11), the constituent unit (a12), the constituent unit (a21) and/or the constituent unit (a22) is preferably 90 mol % or more, more preferably 95 mol % or more, and may be 100 mol %, based on the total proportion of the entire constituent unit constituting the polymer (A12). When the total proportion is 90 mol % or more, good resolution is attained.

The polymer (A12) may comprise, in addition to a constituent unit (a11), a constituent unit (a12), a constituent unit (a21) and a constituent unit (a22), a constituent unit (a3) similar to the polymer (A11).

When the polymer comprises a constituent unit (a3), the proportion of the constituent unit (a3) in the polymer (A12) is preferably from 0.5 to 10 mol %, and more preferably from 2 to 5 mol %, based on the total proportion of the entire constituent unit constituting the polymer (A12). When the proportion of the constituent unit (a3) is more than the above range, solubility in a developing solution tends to deteriorate.

The weight average molecular weight (Mw) of the polymer (A12) is preferably 2,000 or more and 20,000 or less, and more preferably 4,500 or more and 15,000 or less. When the weight average molecular weight is 20,000 or less, dry etching resistance of the resulting resist pattern is improved and thickness loss is improved. Also, the occurrence of microbridge can be prevented. When the weight average molecular weight is 2,000 or more, good heat resistance is attained.

As used herein, microbridge is a kind of development defects and means the defect wherein, in a line-and-space pattern, adjacent patterns in the vicinity of the surface are connected through a resist, resulting in a crosslinked state. Microbridge is likely to occur as the weight average molecular weight increases or the temperature of post exposure baking (PEB) becomes higher.

A monodisperse polymer (A12) having a small dispersity (ratio Mw/Mn) is preferable because of excellent resolution. Specifically, the dispersity is preferably 2.0 or less, and more preferably 1.7 or less.

The polymers (A12) may be used alone or in combination.

The polymer (A12) can be produced, for example, by copolymerizing a monomer corresponding to a constituent unit (a11) with a monomer corresponding to a constituent unit (a12), and protecting a portion of hydrogen atoms of a hydroxyl group of a constituent unit (a11) and/or a constituent unit (a12) with an acid dissociable dissolution inhibiting group using a known technique, thereby forming a constituent unit (a21) and/or a constituent unit (a22).

Alternatively, it can be produced by preparing monomers corresponding to constituent units (a11), (a12), (a21) and (a22) and copolymerizing them using a conventional method.

In the polymer (A21), the proportion of the constituent unit (a11) is preferably from 30 to 70 mol %, more preferably from 35 to 60 mol %, and most preferably from 40 to 55 mol %, based on the total proportion of the entire constituent unit constituting the polymer (A21) in view of resolution and balance with the constituent unit (a21).

In the polymer (A21), the proportion of the constituent unit (a21) is preferably from 30 to 50 mol %, and more preferably from 35 to 45 mol %, based on the total proportion of the entire constituent unit constituting the polymer (A21). By adjusting the proportion to the lower limit or more within the above range, excellent light exposure margin is obtained and resolution, particularly resolution of an isolated line pattern is improved. By adjusting the proportion to the upper limit or less within the above range, good balance with the constituent unit (a11) is attained.

The weight average molecular weight of the polymer (A21) is preferably from 2,000 to 30,000, and more preferably from 5,000 to 20,000.

By adjusting the weight average molecular weight to 30,000 or less, solubility in a resist solvent can be improved. By adjusting the weight average molecular weight to 2,000 or more, good resist pattern shape can be obtained.

A monodisperse polymer (A21) having a small dispersity (ratio Mw/Mn) is preferable because of excellent resolution. Specifically, the dispersity is preferably 2.0 or less, and more preferably 1.5 or less.

These polymers (A21) may be used alone or in combination.

The polymer (A21) can be produced, for example, by a method comprising polymerizing a monomer corresponding to a constituent unit (a11), and protecting a portion of hydrogen atoms of a hydroxyl group of the constituent unit (a11) with acid dissociable dissolution inhibiting group (including an acid dissociable dissolution inhibiting group (III)) using a known method, thereby forming a constituent unit (a21).

Alternatively, it can be produced by a method comprising preliminarily preparing a monomer corresponding to a constituent unit (a21), polymerizing the monomer using a conventional method, converting a portion of hydrogen atoms of a hydroxyl group protected with an acid dissociable dissolution inhibiting group into hydrogen atoms through hydrolysis, thereby forming a constituent unit (a11).

In the component (A), a ratio (mass ratio) of a polymer (A1) to a polymer (A2) is preferably within a range from 10/90 to 90/10, more preferably from 20/80 to 80/20, and still more preferably from 20/80 to 70/30. By adjusting the ratio within the above range, particularly excellent effects of the present invention are exerted.

The total proportion of the polymer (A1) and the polymer (A2) in the component (A) is preferably from 50 to 100% by weight, and more preferably from 70 to 100% by weight, for the effects of the present invention. Most preferably, the total proportion is a 100% by weight, that is, the component (A) is a mixed resin of the polymer (A1) and the polymer (A2).

In the positive resist composition of the present invention, the content of the component (A) may be adjusted according to the thickness of the resist film to be formed.

The component (B) is not specifically limited and it is possible to use those which have conventionally been proposed as an acid generator for a chemically amplified photoresist. As the acid generator, there have been known various acid generators, for example, onium salt-based acid generators such as iodonium and sulfonium salts; oxime sulfonate-based acid generators; diazomethane-based acid generators such as bisalkyl or bisarylsulfonyl diazomethanes, and nitrobenzylsulfonate-based acid generators; poly(bissulfonyl)diazomethanes; iminosulfonate-based acid generators; and disulfone-based acid generators.

Examples of the onium salt-based acid generators include compounds represented by the following general formulas (b-1) and (b-2):

[Chemical Formula 7]

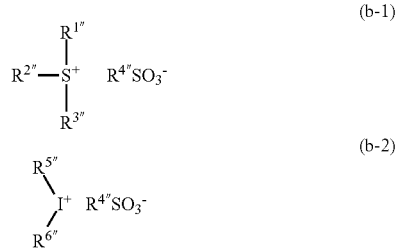

wherein $R^{1\prime\prime}$ to $R^{3\prime\prime}$, $R^{5\prime\prime}$ to $R^{6\prime\prime}$ each independently represents an aryl group or an alkyl group; $R^{4\prime\prime}$ represents a linear, branched or cyclic alkyl or fluorinated alkyl group; and at least one of $R^{1\prime\prime}$ to $R^{3\prime\prime}$ represents an aryl group, and at least one of $R^{5\prime\prime}$ to $R^{6\prime\prime}$ represents an aryl group.

In the formula (b-1), $R^{1\prime\prime}$ to $R^{3\prime\prime}$ each independently represents an aryl group or an alkyl group. Among $R^{1\prime\prime}$ to $R^{3\prime\prime}$, at least one substituent represents an aryl group. Among $R^{1\prime\prime}$ to $R^{3\prime\prime}$, two or more substituents are preferably aryl groups and all of $R^{1\prime\prime}$ to $R^{3\prime\prime}$ are most preferably aryl groups.

The aryl group of $R^{1\prime\prime}$ to $R^{3\prime\prime}$ is not specifically limited and is, for example, an aryl group having 6 to 20 carbon atoms and a portion or all of hydrogen atom of the aryl group may be substituted with an alkyl group, an alkoxy group or a halogen atom, or not substituted. The aryl group is preferably an aryl group having 6 to 10 carbon atoms because it is possible to synthesize at a low price. Specific examples thereof include phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group of $R^{1\prime\prime}$ to $R^{3\prime\prime}$ is not specifically limited and includes, for example, a linear, branched or cyclic alkyl group having 1 to 10 carbon atoms. In view of excellent resolution, the alkyl group preferably has 1 to 5 carbon atoms. Specific examples thereof include methyl group, ethyl group, n-propyl group, isopropyl group, n-butyl group, isobutyl group, n-pentyl group, cyclopentyl group, hexyl group, cyclohexyl group, nonyl group, and decanyl group, and a methyl group is most preferable because it is excellent in resolution and is possible to synthesize at a low price.

It is most preferable that all of $R^{1\prime\prime}$ to $R^{3\prime\prime}$ are phenyl groups.

$R^{4\prime\prime}$ represents a linear, branched or cyclic alkyl or fluorinated alkyl group.

The linear alkyl group preferably has 1 to 10 carbon atoms, more preferably 1 to 8 carbon atoms, and most preferably 1 to 4 carbon atoms. The cyclic alkyl group is preferably a cyclic group, as described as for $R^{1\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. A fluorination ratio of the fluorinated alkyl group (proportion of fluorine atoms in an alkyl group) is preferably from 10 to 100%, more preferably from 50 to 100%, and it is preferable that all hydrogen atoms are substituted with a fluorine atom because acid strength increases.

$R^{4\prime\prime}$ is most preferably a linear or cyclic alkyl or fluorinated alkyl group.

In the formula (b-2), $R^{5\prime\prime}$ to $R^{6\prime\prime}$ each independently represents an aryl or alkyl group. Among $R^{5\prime\prime}$ to $R^{6\prime\prime}$, at least one represents an aryl group. All of $R^{5\prime\prime}$ to $R^{6\prime\prime}$ are preferably aryl groups.

Examples of the aryl group of $R^{5\prime\prime}$ to $R^{6\prime\prime}$ include the same aryl groups as those of $R^{1\prime\prime}$ to $R^{3\prime\prime}$.

Examples of the alkyl group of $R^{5\prime\prime}$ to $R^{6\prime\prime}$ include the same alkyl groups as those of $R^{1\prime\prime}$ to $R^{3\prime\prime}$.

It is most preferable that all of $R^{5\prime\prime}$ to $R^{6\prime\prime}$ are phenyl groups.

Examples of $R^{4\prime\prime}$ in the formula (b-2) include the same as those in the formula (b-1).

Specific examples of the onium salt-based acid generator include trifluoromethanesulfonate or nonafluorobutanesulfonate of diphenyliodonium, trifluoromethanesulfonate or nonafluorobutanesulfonate of bis(4-tert-butylphenyl)iodonium, trifluoromethanesulfonate of triphenylsulfonium, heptafluoropropanesulfonate thereof or nonafluorobutanesulfonate thereof, trifluoromethanesulfonate of tri(4-methylphenyl)sulfonium, heptafluoropropanesulfonate thereof or nonafluorobutanesulfonate thereof, trifluoromethanesulfonate of dimethyl(4-hydroxynaphthyl)sulfonium, heptafluoropropanesulfonate thereof or nonafluorobutanesulfonate thereof trifluoromethanesulfonate of monophenyldimethylsulfonium, heptafluoropropanesulfonate thereof or nonafluorobutanesulfonate thereof, trifluoromethanesulfonate of diphenylmonomethylsulfonium, heptafluoropropanesulfonate thereof or nonafluorobutanesulfonate thereof, trifluoromethanesulfonate of (4-methylphenyl)diphenylsulfonium, heptafluoropropanesulfonate thereof or nonafluorobutanesulfonate thereof, trifluoromethanesulfonate of (4-methoxyphenyl)diphenylsulfonium, heptafluoropropanesulfonate thereof or nonafluorobutanesulfonate thereof, trifluoromethanesulfonate of tri(4-tert-butyl)phenylsulfonium, heptafluoropropanesulfonate thereof or nonafluorobutanesulfonate thereof, and rifluoromethanesulfonate of diphenyl(1-(6-methoxy)naphthyl)sulfonium, heptafluoropropanesulfonate thereof or nonafluorobutanesulfonate thereof. It is also possible to use onium salts in which the anion moiety of these onium salts are replaced by methanesulfonate, n-propanesulfonate, n-butanesulfonate, or n-octanesulfonate.

It is also possible to use those in which the anion moiety is replaced by the anion moiety represented by the following general formula (b-3) or (b-4) in the general formula (b-1) or (b-2) (the cation moiety is as defined in the general formula (b-1) or (b-2)):

[Chemical Formula 8]

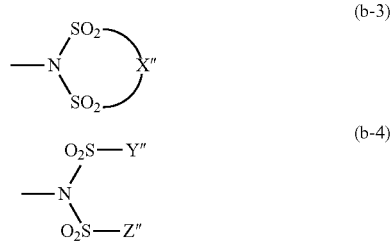

wherein X" represents an alkylene group having 2 to 6 carbon atoms in which at least one hydrogen atom is substituted with a fluorine atom; and Y" and Z" each independently represents an alkyl group having 1 to 10 carbon atoms in which at least one hydrogen atom is substituted with a fluorine atom.

X" represents a linear or branched alkylene group in which at least one hydrogen atom is substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom is substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of X" or those of the alkyl group of Y" and Z" within the range of the number of carbon atoms, the more the solubility in a resist solvent becomes better.

Also, in the alkylene group of X" or the alkyl group of Y" and Z", as the number of hydrogen atoms substituted with a fluorine atom increases, transparency to high energy light having a wavelength of 200 nm or less or electron beam is improved, and therefore it is preferable. The proportion of fluorine atoms in the alkylene or alkyl group, that is, the fluorination ratio is preferably from 70 to 100%, more preferably from 90 to 100%, and most preferably a perfluoroalkylene or perfluoroalkyl group in which all hydrogen atoms are substituted with a fluorine atom.

In the present invention, the oxime sulfonate-based acid generator is a compound which has at least one group represented by the following general formula (B-1) and has characteristics capable of generating an acid upon irradiation with radiation. Such an oxime sulfonate-based acid generator is widely used for a chemically amplified photoresist composition and therefore can be optionally selected when used:

[Chemical Formula 9]

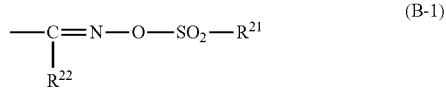

in the formula (B-1), $R^{21}$ and $R^{22}$ each independently represents an organic group.

In the present invention, an organic group is a group having a carbon atom and may have the atom other than carbon atom (for example, hydrogen atom, oxygen atom, nitrogen atom, sulfur atom, halogen atom (fluorine atom or chlorine atom), etc.).

The organic group of $R^{21}$ is preferably a linear, branched or cyclic alkyl group or aryl group. These alkyl and aryl groups may have a substituent. The substituent is not specifically limited and examples thereof include fluorine atom, and linear, branched or cyclic alkyl group having 1 to 6 carbon atoms. As used herein, the phrase "having a substituent" means that a portion or all of hydrogen atoms of the alkyl or aryl group are substituted with a substituent.

The alkyl group preferably has 1 to 20 carbon atoms, more preferably 1 to 10 carbon atoms, still more preferably 1 to 8 carbon atoms, particularly preferably 1 to 6 carbon atoms, and most preferably 1 to 4 carbon atoms. Particularly preferably, the alkyl group is a partially or completely halogenated alkyl group (hereinafter sometimes referred to as a halogenated alkyl group). The partially halogenated alkyl group means an alkyl group in which a portion of hydrogen atoms are substituted with a halogen atom, while the completely halogenated alkyl group means an alkyl group in which all of hydrogen atoms are substituted with halogen atoms. The halogen atom includes a fluorine atom, a chlorine atom, a bromine atom, and an iodine atom, and is particularly preferably a fluorine atom. That is, the halogenated alkyl group is preferably a fluorinated alkyl group.

The aryl group preferably has 4 to 20 carbon atoms, more preferably 4 to 10 carbon atoms, and most preferably 6 to 10 carbon atoms. Particularly preferable, the aryl group is a partially or completely halogenated aryl group. The partially halogenated aryl group means an aryl group in which a portion of hydrogen atoms are substituted with a halogen atom, while the completely halogenated aryl group means an aryl group in which all of hydrogen atoms are substituted with halogen atoms.

$R^{21}$ is particularly preferably an alkyl group having 1 to 4 carbon atoms which has no substituent, or a fluorinated alkyl group having 1 to 4 carbon atoms.

The organic group of $R^{22}$ is preferably a linear, branched or cyclic alkyl aryl or cyano group. Examples of the alkyl group and the aryl group $R^{22}$ include the same alkyl group and aryl group as those described as for $R^{21}$.

$R^{22}$ is particularly preferably a cyano group, an alkyl group having 1 to 8 carbon atoms which has no substituent, or a fluorinated alkyl group having 1 to 8 carbon atoms.

Examples of more preferable oxime sulfonate-based acid generator include compounds represented by the following general formula (B-2) or (B-3):

[Chemical Formula 10]

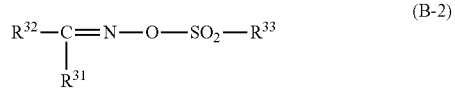

in the formula (B-2), $R^{31}$ represents a cyano group, or an alkyl or halogenated alkyl group which has no substituent, $R^{32}$ represents an aryl group, and $R^{33}$ represents an alkyl or halogenated alkyl group which has no substituent, and

[Chemical Formula 11]

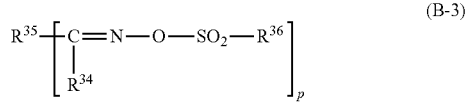

(B-3)

in the formula (B-3), $R^{34}$ represents a cyano group, or an alkyl or halogenated alkyl group which has no substituent, $R^{35}$ represents a di- or trivalent aromatic hydrocarbon group, $R^{36}$ represents an alkyl or halogenated alkyl group which have no substituent, and p represents 2 or 3.

In the general formula (B-2), the alkyl or halogenated alkyl group which has no substituent of $R^{31}$ preferably has 1 to 10 carbon atoms, more preferably 1 to 8 carbon atoms, and most preferably 1 to 6 carbon atoms.

$R^{31}$ is preferably a halogenated alkyl group, and more preferably a fluorinated alkyl group.

Regarding the fluorinated alkyl group in $R^{31}$, hydrogen atoms of the alkyl group are preferably fluorinated in the proportion of 50% or more, more preferably 70% or more, and still more preferably 90% or more.

Example of the aryl group of $R^{32}$ include groups in which one hydrogen atom is eliminated from the ring of an aromatic hydrocarbon, such as phenyl group, biphenylyl group, fluorenyl group, naphthyl group, anthracyl group, and phenanthryl group; and heteroaryl groups in which a portion of carbon atoms constituting the ring of these groups are substituted with a heteroatom such as oxygen atom, sulfur atom, or nitrogen atom. Among these aryl groups, a fluorenyl group is preferable.

The aryl group of $R^{32}$ may have a substituent such as alkyl group, halogenated alkyl group, or alkoxy group, each having 1 to 10 carbon atoms. The alkyl group or halogenated alkyl group in the substituent preferably has 1 to 8 carbon atoms, and more preferably 1 to 4 carbon atoms. The halogenated alkyl group is preferably a fluorinated alkyl group.

The alkyl group or halogenated alkyl group which has no substituent of $R^{33}$ preferably has 1 to 10 carbon atoms, more preferably has 1 to 8 carbon atoms, and most preferably has 1 to 6 carbon atoms.

$R^{33}$ is preferably a halogenated alkyl group, and more preferably a fluorinated alkyl group.

Regarding the fluorinated alkyl group in $R^{33}$, hydrogen atoms of the alkyl group are preferably fluorinated in the proportion of 50% or more, more preferably 70% or more, and still more preferably 90% or more, because the strength of the acid generated increases. A completely fluorinated alkyl group in which 100% of hydrogen atoms are substituted with fluorine is most preferable.

In the general formula (B-3), examples of the alkyl or halogenated alkyl group which has no substituent of $R^{34}$ include the same alkyl group or halogenated alkyl group as that of $R^{31}$.

The di- or trivalent aromatic hydrocarbon group of $R^{35}$ includes a group in which one or two hydrogen atoms are further eliminated from the aryl group of $R^{32}$.

Examples of the alkyl or halogenated alkyl group which has no substituent of $R^{36}$ include the same alkyl or halogenated alkyl group which has no substituent as that of $R^{33}$.

p is preferably 2.

Specific examples of the oxime sulfonate-based acid generator include α-(p-toluenesulfonyloxyimino)-benzylcyanide, α-(p-chlorobenzenesulfonyloxyimino)-benzylcyanide, α-(4-nitrobenzenesulfonyloxyimino)-benzylcyanide, α-(4-nitro-2-trifluoromethylbenzenesulfonyloxyimino)-benzylcyanide, α-(benzenesulfonyloxyimino)-4-chlorobenzylcyanide, α-(benzenesulfonyloxyimino)-2,4-dichlorobenzylcyanide, α-(benzenesulfonyloxyimino)-2,6-dichlorobenzylcyanide, α-(benzenesulfonyloxyimino)-4-methoxybenzylcyanide, α-(2-chlorobenzenesulfonyloxyimino)-4-methoxybenzylcyanide, α-(benzenesulfonyloxyimino)-thien-2-ylacetonitrile, α-(4-dodecylbenzenesulfonyloxyimino)-benzylcyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienylcyanide, α-(methylsulfonyloxyimino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-cyclohexylacetonitrile, α-(ethylsulfonyloxyimino)-ethylacetonitrile, α-(propylsulfonyloxyimino)-propylacetonitrile, α-(cyclohexylsulfonyloxyimino)-cyclopentylacetonitrile, α-(cyclohexylsulfonyloxyimino)-cyclohexylacetonitrile, α-(cyclohexylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, α-(n-butylsulfonyloxyimino)-1-cyclohexenylacetonitrile, α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile.

The oxime sulfonate-based acid generator further includes compounds represented by the following chemical formula: Group of compounds (B-i):

[Chemical Formula 12]

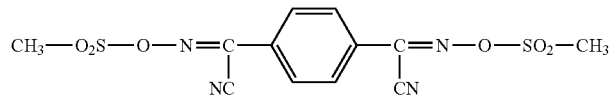

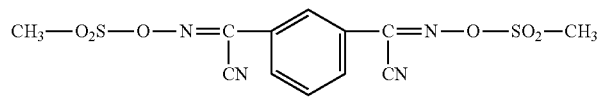

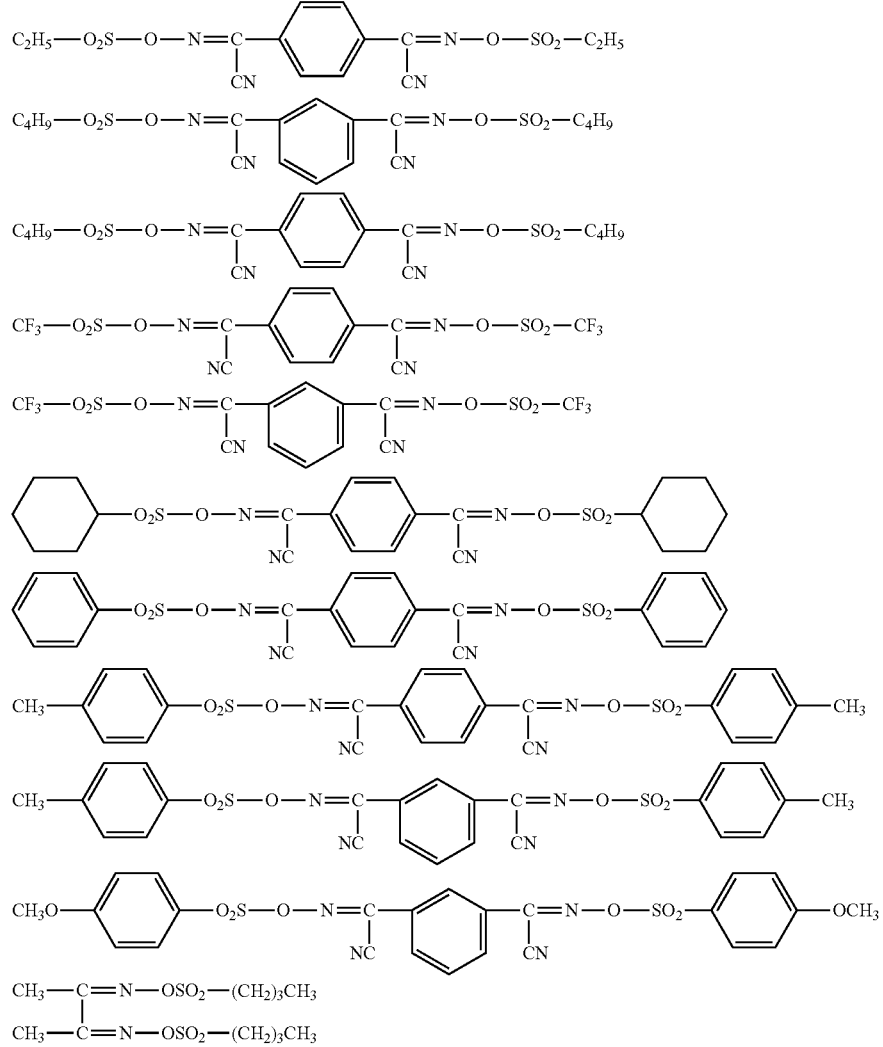
Among compounds represented by the general formula (B-2) or (B-3), examples of preferable compound are shown below.
Group of compounds (B-ii):
[Chemical Formula 13]
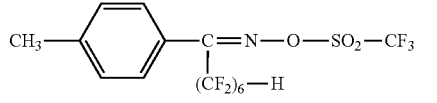
(B-iii)
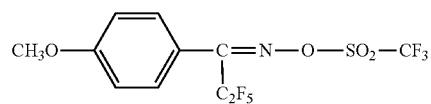
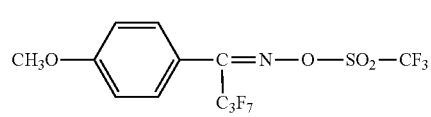
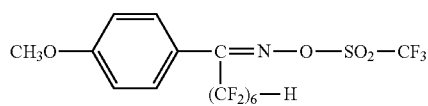
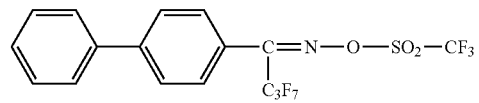
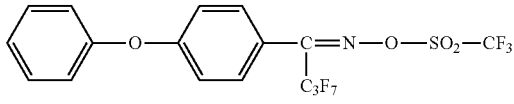
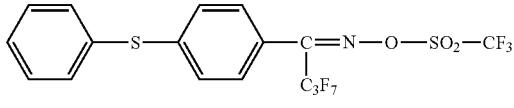
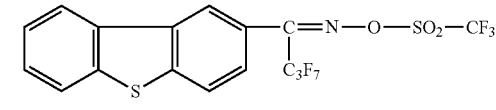

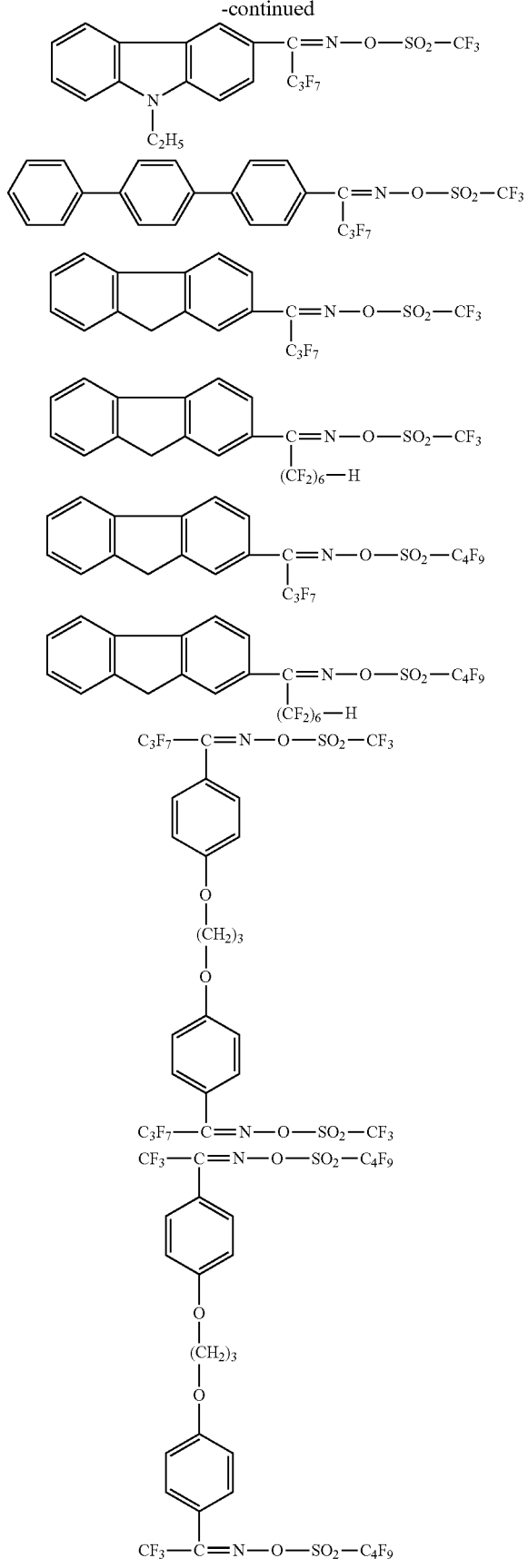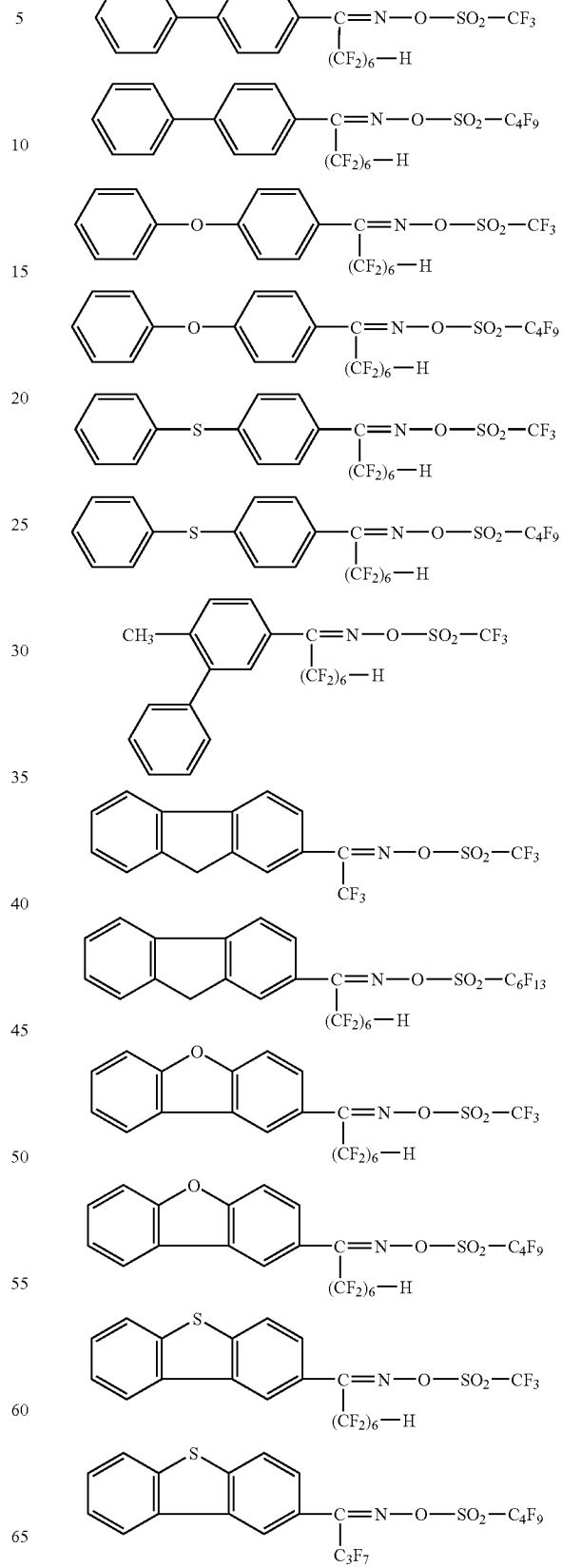

-continued

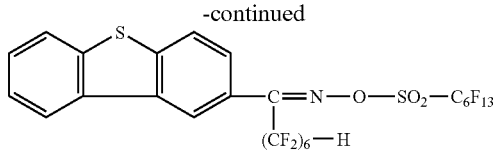

Among the above compounds, the following three compounds are preferable.

[Chemical Formula 15]

(B-i-1)

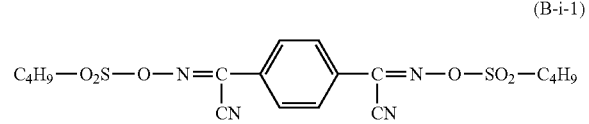

[Chemical Formula 16]

(B-i-2)

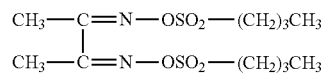

[Chemical Formula 17]

(B-ii-3)

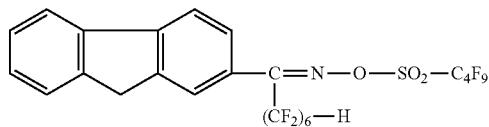

Among the diazomethane-based acid generator, specific examples of bisalkyl or bisarylsulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Examples of poly(bissulfonyl)diazomethanes include 1,3-bis(phenylsulfonyldiazomethylsulfonyl)propane (compound A), 1,4-bis(phenylsulfonyldiazomethylsulfonyl)butane (compound B), 1,6-bis(phenylsulfonyldiazomethylsulfonyl)hexane (compound C), 1,10-bis(phenylsulfonyldiazomethylsulfonyl)decane (compound D), 1,2-bis(cyclohexylsulfonyldiazomethylsulfonyl)ethane (compound E), 1,3-bis(cyclohexylsulfonyldiazomethylsulfonyl)propane (compound F), 1,6-bis(cyclohexylsulfonyldiazomethylsulfonyl)hexane (compound G), and 1,10-bis(cyclohexylsulfonyldiazomethylsulfonyl)decane (compound H), each having the following structure.

[Chemical Formula 18]

COMPOUND A

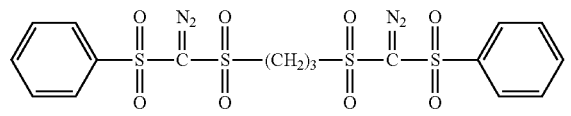

COMPOUND B

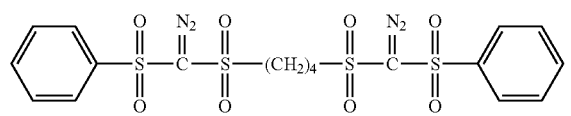

COMPOUND C

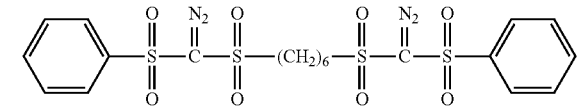

COMPOUND D

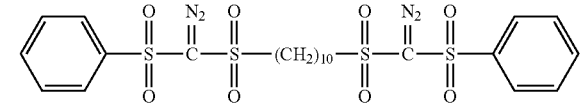

COMPOUND E

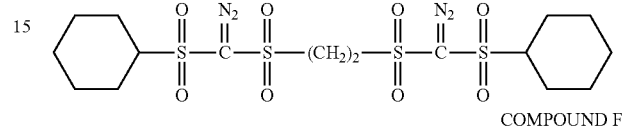

COMPOUND F

COMPOUND G

COMPOUND H

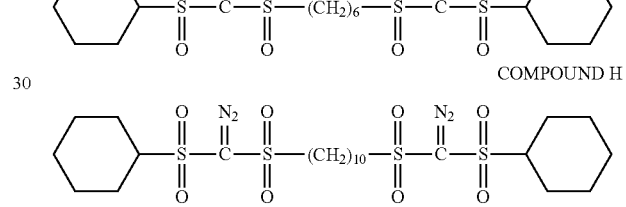

It is preferable to contain, as the component (B), at last one kind selected from the group consisting of an onium salt-based acid generator containing fluorinated alkylsulfonic acid ions as anions and an oxime sulfonate-based acid generator, and it is more preferable to contain both of the onium salt-based acid generator containing fluorinated alkylsulfonic acid ions as anions and the oxime sulfonate-based acid generator. Thus, high resolution can be attained.

As the component (B), these acid generators may be used alone or in combination.

The content of the component (B) in the positive resist composition of the present invention is adjusted within a range from 0.5 to 30 parts by mass, and preferably from 1 to 10 parts by mass, based on 100 parts by mass of the component (A). A pattern is sufficiently formed by adjusting the content within the above range. The rage is preferable also because a uniform solution is obtained and storage stability is improved.

[Aromatic Amine (C)]

In the present invention, it is preferable to contain aromatic amine (C) (hereinafter sometimes referred to as a component (C)), together with the components (A) and (B) described above. By using these components in combination, size controllability is improved.

In the present invention, "aromatic amine" means a compound in which at least one hydrogen atom of ammonia $NH_3$ is substituted with an organic group having aromaticity (hereinafter sometimes referred to as an aromatic group) such as aromatic hydrocarbon group, or a group in which a portion of carbon atoms constituting the aromatic hydrocarbon group are substituted with a heteroatom such as nitrogen atom.

The aromatic hydrocarbon group preferably has 4 to 20 carbon atoms, more preferably 5 to 15 carbon atoms, and most preferably 6 to 10 carbon atoms.

Specific examples of the aromatic hydrocarbon group include groups in which one hydrogen atom is eliminated form an aromatic ring such as benzene, naphthalene, or anthracene (for example, phenyl group, naphthyl, anthracenyl group, etc.); and groups in which a portion of a linear or branched alkyl group having 1 to 5 carbon atoms are substituted with an aromatic ring (for example, benzyl group, phenylethyl group ($C_6H_5$—$CH_2$—$CH_2$—), naphthylmethyl group ($C_{10}H_7$—$CH_2$—), naphthylethyl group ($C_{10}H_7$—$CH_2$—$CH_2$—), etc.). In these groups, the aromatic ring may have a substituent and the substituent includes an alkyl group having 1 to 5 carbon atoms.

The aromatic group is preferably an aromatic hydrocarbon group, more preferably a phenyl group or a benzyl group, and particularly preferably a benzyl group, because of excellent effects of the present invention.

The component (C) is classified into a primary amine (X'$NH_2$), a secondary amine (X'$_2$NH), and a tertiary amine (X'$_3$N) according to the number of hydrogen atoms substituted with an atom other than a hydrogen atom, or a substituent X' (containing at least one aromatic group) among three hydrogen atoms of ammonia $NH_3$. In the present invention, the aromatic amine is preferably a secondary amine and/or a tertiary amine, and more preferably a tertiary amine, because of excellent stability in vacuum.

In the primary amine, X' (an atom other than hydrogen atom, or a substituent) is an aromatic group. In the secondary amine and/or tertiary amine, X' may have at least one aromatic group and may further contain a linear, branched or cyclic aliphatic hydrocarbon group having 1 to 5 carbon atoms, or a group in which a portion of carbon atoms of the aliphatic hydrocarbon group are substituted with a heteroatom such as nitrogen atom.

Also, the component (C) may be a monoamine containing 1 nitrogen atoms in a molecule, or a polyamine such as a diamine containing 2 nitrogen atoms in a molecule (phenylenediamine, benzidine, diaminonaphthalene, tolidine, etc.), a triamine containing 3 nitrogen atoms in a molecule, or a tetraamine containing 4 nitrogen atoms in a molecule. Among these amines, a monoamine is preferable.

More specifically, the component (C) includes compounds represented by the following general formula (c-1):

[Chemical Formula 19]

(c-1)

wherein $R^{11}$ to $R^{13}$ each independently represents a hydrogen atom, an alkyl group having 1 to 10 carbon atoms or an aromatic hydrocarbon group, and at least one of $R^{11}$ to $R^{13}$ represents an aromatic hydrocarbon group.

A compound in which two of $R^{11}$ to $R^{13}$ are hydrogen atoms is a primary amine, a compound in which one of $R^{11}$ to $R^{13}$ is a hydrogen atom is a secondary amine, and a compound in which all of $R^{11}$ to $R^{13}$ are groups other than a hydrogen atom is a tertiary amine.

In $R^{11}$ to $R^{13}$, an alkyl group having 1 to 10 carbon atoms may be linear, branched or aliphatic cyclic. In the case of the linear or branched alkyl group, the number of carbon atom is preferably from 1 to 6, and more preferably from 1 to 4. Specific examples thereof include methyl group, ethyl group, n-propyl group, isopropyl group, n-butyl group, isobutyl group, and tert-butyl group.

In $R^{11}$ to $R^{13}$, when the alkyl group having 1 to 10 carbon atoms is aliphatic cyclic, the number of carbon atoms is preferably from 3 to 10, and more preferably from 4 to 6. Specific examples thereof include cyclopentyl group and cyclohexyl group.

In $R^{11}$ to $R^{13}$, examples of the aromatic hydrocarbon group include the same as those described above.

Among $R^{11}$ to $R^{13}$, at least one group must be an aromatic hydrocarbon group, and two or more groups are preferably aromatic hydrocarbon groups and all groups are most preferably aromatic hydrocarbon groups because of excellent stability in vacuum.

Specific examples of the compound represented by the formula (c-1) include primary amines such as benzylamine, phenylamine, and phenethylamine; secondary amines such as dibenzylamine, diphenylamine, and diphenethylamine; and tertiary amines such as triphenylamine, tribenzylamine, and triphenethylamin. Among these amines, triphenylamine and tribenzylamine are preferable because they provide excellent effects of the present invention. Tribenzylamine is particularly preferable because it can adjust sensitivity to sensitivity suited for use as a resist composition and is also excellent in resolution.

These compounds may be used alone or in combination.

The content of the component (C) in the positive resist composition of the present invention is preferably from 0.1 to 10 parts by mass, more preferably from 0.3 to 5 parts by mass, and still more preferably from 0.5 to 3 parts by mass, based on 100 parts by mass of the component (A). The content is preferably the lower limit or more and the upper limit or less because of excellent effects of the present invention.

[Organic Solvent]

The positive resist composition of the present invention can be prepared by dissolving a component (A), a component (B) and, preferably, a component (C) and optional components described hereinafter in an organic solvent.

The organic solvent may be any organic solvent which can dissolve the respective components to give a uniform solution, and one or more kinds of any organic solvents selected appropriately from among those known as a solvent for a chemically amplified photoresist can be used alone or in combination.

Examples thereof include lactones such as γ-butyrolactone; ketones such as acetone, methyl ethyl ketone, cyclohexanone, methyl isoamyl ketone, and 2-heptanone; polyhydric alcohols and derivatives thereof, such as ethylene glycol, ethylene glycol monoacetate, diethylene glycol, diethylene glycol monoacetate, propylene glycol, propylene glycol-mono acetate, dipropylene glycol, and monomethylether, monoethylether, monopropylether, monobutylether or monophenylether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used alone or in combination.

A mixed solvent prepared by mixing propylene glycol monomethylether acetate (PGMEA) with a polar solvent is preferable. The mixing ratio (mass ratio) may be appropriately decided taking account of compatibility between GMEA and a polar solvent, and is preferably from 1:9 to 9:1, and more preferably from 2:8 to 8:2. More specifically, when EL is mixed as the polar solvent, a mass ratio PGMEA:EL is preferably from 1:9 to 9:1, and more preferably from 2:8 to 8:2.

In addition, the organic solvent is preferably a mixed solvent of at least one selected from PGMEA and EL, and γ-butyrolactone. In this case, the mixing ratio, that is, the mass ratio of the former to the later is preferably from 70:30 to 95:5.

The amount of the organic solvent is not specifically limited and is adjusted to a concentration which enables coating of a coating solution to a substrate, and is appropriately set according to the thickness of the coating film. It is usually used so that the solid content of the resist composition is within a range from 2 to 20% by weight, and preferably from 5 to 15% by weight.

[Other Components]

The positive resist composition of the present invention can further contain, as an optional component, a nitrogen-containing organic compound (excluding the component (B) and the component (C)) (D) (hereinafter referred to as a component (D)) so as to improve resist pattern shape and post exposure stability of the latent image formed by the pattern-wise exposure of the resist layer.

Since various ones are proposed as the component (D), any one may be selected from known ones and used. Examples thereof include monoalkylamine such as n-hexylamine, n-heptylamine, n-octylamine, n-nonylamine, or n-decylamine; dialkylamine such as diethylamine, di-n-propylamine, di-n-heptylamine, di-n-octylamine, or dicyclohexylamine; trialkylamine such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and alkyl alcoholamine such as diethanolamine, triethanolamine, diisopropanolamine, triisopropanolamine, di-n-octanolamine, or tri-n-octanolamine. Among these, a secondary aliphatic amine and a tertiary aliphatic amine are preferable, and trialkyl amines having 5 to 10 carbon atoms are more preferable, and a tri-n-octylamine is most preferable.

These components may be used alone or in combination.

The component (D) is usually used in an amount within a range from 0.01 to 3.0 parts by mass, and preferably from 0.05 to 2 parts by mass based on 100 parts by mass of the component (A).

The positive resist composition of the present invention can further contain, as an optional component, an organic carboxylic acid, or oxo acid of phosphorus, or a derivative thereof (E) (hereinafter referred to as a component (E)) for the purpose of preventing deterioration of sensitivity by mixing of the components (C) and/or (D), and improving resist pattern shape, and post exposure post exposure stability of the latent image formed by the pattern-wise exposure of the resist layer. The components (D) and (E) can be used alone or in combination.

As the organic carboxylic acid, for example, malonic acid, citric acid, malic acid, succinic acid, benzoic acid, and salicylic acid are preferable.

Examples of the oxo acid of phosphorus or the derivative thereof include phosphoric acid or a derivative such as ester thereof, such as phosphoric acid, di-n-butyl phosphate ester, or diphenyl phosphate ester; phosphonic acid or a derivative such as ester thereof, such as phosphonic acid, dimethyl phosphonate ester, di-n-butyl phosphonate ester, phenylphosphonic acid, diphenyl phosphonate ester, or dibenzyl phosphonate ester; and phosphinic acid or a derivative such as ester thereof, such as phosphinic acid or phenylphosphinic acid. Among these, phosphonic acid is particularly preferable.

The component (E) is usually used in the proportion within a range from 0.01 to 5.0 parts by mass based on 100 parts by mass of the component (A).

To the positive resist composition of the present invention, if desired, additives having miscibility, for example, additive resins for improving performances of a resist film, surfactants for improving coatability, dissolution inhibitors, plasticizers, stabilizers, colorants, antihalation agents, and dyes can be appropriately added.

As described above, the positive resist composition of the present invention is excellent in size controllability. The composition is also excellent in size controllability even on a substrate on which a chromium oxide layer is laminated. This is because the positive resist composition of the present invention can form a resist film which is less likely to cause a change in performances in vacuum, that is, a resist film having high stability in vacuum. That is, in the production of a photomask, the resist film was conventionally exposed by direct drawing using electron beam in vacuum (for example, $1 \times 10^{-7}$ to $1 \times 10^{-5}$ Pa). However, in the exposure by direct drawing using electron beam, a long time (for example, about 12 to 24 hours) is required from the beginning to the completion of drawing with miniaturization of a pattern. Therefore, there arises a difference in the time required from exposure to post exposure baking (PEB) or development between firstly exposed area and finally exposed area in the same substrate surface. It is considered that a conventional resist film has low stability in vacuum and causes a change in performances with time and, therefore a difference in performances of the resist arises and the pattern size of the firstly exposed area is different from that of the finally exposed area, resulting in poor size controllability, while the positive resist composition of the present invention has high stability in vacuum and causes small change in performances with time and is therefore excellent in size controllability. Although the reason why stability in vacuum is high is not sure, it is considered that, when the positive resist composition of the present invention contains an aromatic amine, an aromatic amine is less likely to be volatilized from the film in vacuum, as compared with an aliphatic amine such as trioctylamine which was conventionally added as a nitrogen-containing compound, and thus the composition is less likely to cause a change in performances and is stable.

The positive resist composition of the present invention is less likely affected by the substrate. Even if any substrate is used, for example, a silicone substrate, an antireflective film or a chromium oxide layer is used, a rectangular pattern can be formed on the substrate. For example, a substrate obtained by laminating a chromium oxide layer is usually used as a substrate in the production of a photomask. When a resist pattern is formed on the chromium oxide layer using a chemically amplified photoresist so as to produce a photomask with a fine pattern, an acid generated from an acid generator at the boundary portion with the chromium oxide layer is deactivated by an influence of the chromium oxide layer. For example, the positive resist composition has a problem that the portion remains alkali-insoluble and the resist at the boundary portion with the substrate is remained without being removed after the development, and thus making it impossible to form a rectangular pattern. When the shielding layer is etched using such a resist pattern having poor shape as the photomask, faithful transfer of a pattern cannot be conducted and a precise photomask cannot be obtained, and therefore it is inconvenient. On the other hand, the positive resist composition of the present invention is less likely to be affected by the chromium oxide layer and a rectangular pattern can be formed on the chromium oxide layer.

Therefore, the positive resist composition of the present invention is suited for the production of a photomask. As described above, the positive resist composition of the present invention has high stability in vacuum and causes small change in performances with time and is therefore excellent in size controllability and also can form a rectangular pattern on a chromium oxide layer, and thus faithful transfer of a pattern onto the chromium oxide layer can be conducted and a precise photomask can be obtained by using the positive resist composition of the present invention.

<Resist Pattern Forming Method>

A resist pattern forming method of the present invention can be performed in the following manner.

First, the above positive resist composition is coated on a substrate such as silicone wafer using a spinner, and prebaked under temperature conditions of 80 to 150° C. for 40 to 120 seconds, preferably 60 to 90 seconds, followed by selective exposure to electron beam or far ultraviolet rays directly or through a desired mask pattern using an electron beam lithography system or the like. After drawing by exposing through a mask pattern, or by directly exposing to electron beam through no mask pattern, a heat treatment (post exposure baking (PEB)) is performed under temperature conditions of 80 to 150° C. for 40 to 120 seconds, preferably 60 to 90 seconds. Then, a development treatment is performed using an alkali developing solution, for example, an aqueous 0.1 to 10 mass % tetramethylammonium hydroxide solution. Thus, it is possible to obtain a resist pattern which is faithful to the mask pattern.

It is also possible to provide an organic or inorganic antireflective film between the substrate and the coating layer of the resist composition.

The wavelength of the electron beam or far ultraviolet rays to be used for exposure is not specifically limited and the exposure can be conducted using radiations such as ArF excimer laser, KrF excimer laser, $F_2$ laser, EUV (extreme ultraviolet rays), VUV (vacuum ultraviolet rays), electron beam, X-rays, and soft X-rays.

The positive resist composition of the present invention can be preferably used for formation of a resist pattern including an exposure step under vacuum because of high stability under vacuum, and is therefore preferable for electron beam or EUV (extreme ultraviolet rays), and particularly preferably electron beam.

Furthermore, when a photomask is produced using the positive resist composition of the present invention, particularly positive resist compositions of first and third aspects, a resist pattern can be formed in the following manner. That is, a positive resist film is formed on a glass substrate, on which a chromium oxide layer is laminated, using the positive resist composition of the present invention for production of a photomask, and the positive resist film is selectively exposed, and then the positive resist film is subjected to a heat treatment (PEB) and a development treatment to form a resist pattern.

Specifically, first, a glass substrate comprising a chromium oxide layer laminated on one surface is prepared. The chromium oxide layer is a layer made mainly of chromium oxide and the chromium oxide includes chromium oxide selected from the group consisting of compounds represented by $Cr_aO_b$ (in this chemical formula, a represents an integer of 1 to 2, and preferably 1, and b represents an integer of 3 to 4, and preferably 4) or a mixture of two or more kinds of the chromium oxides.

On a glass substrate with the chromium oxide layer formed thereon, a solution of the positive resist composition of the present invention for production of a photomask is coated using a spinner and then dried to form a positive resist film.

Then, the positive resist film is subjected to a selective exposure treatment. In the exposure treatment, KrF excimer laser, ArF excimer laser, $F_2$ excimer laser, EUV (Extreme ultraviolet rays), electron beam, soft X-rays, and X-rays can be used, and the exposure treatment can be conducted by irradiation through a desired mask pattern, or direct drawing. In the present invention, electron beam is preferably used in the exposure treatment and direct drawing using electron beam is preferably employed.

Subsequently, a post exposure baking (PEB) treatment is conducted. Heating conditions in the PEB treatment vary depending on kinds and proportions of the respective components in the resist composition as well as thickness of the coating film, and the post exposure baking treatment is conducted at 80 to 150° C. for 40 to 120 seconds, and preferably about 60 to 90 seconds.

After the PEB treatment, a positive resist pattern is obtained by developing with a developing solution such as aqueous alkali solution and subjecting to optional treatments such as washing with water and drying. The developing solution is not specifically limited and a conventional aqueous alkali solution can be used and, for example, an aqueous solution of TMAH (tetramethylammonium hydroxide) in the concentration of 2.38% by weight is preferably used.

Furthermore, a photomask comprising a glass substrate and a chromium oxide layer having a predetermined pattern formed thereon can be produced by etching a chromium oxide layer at the area where no pattern is formed, using the resist pattern as a mask, and transferring the pattern onto the chromium oxide layer.

EXAMPLES

Examples of the present invention will now be described, but the scope of the present invention is not limited to the following Examples.

Examples and Comparative Examples according to first and second aspects of the present invention will now be described.

Example 1 to 4, Comparative Example 1, Examples 5 to 8, Comparative Example 2, Examples 9 to 12, Comparative Example 3, Examples 13 to 16, Comparative Example 4

100 Parts by mass of the component (A) shown in Table 1, 8 parts by mass of α-(methyloxyimino)-p-methoxyphenylacetonitrile as the component (B), the amine shown in Table 1 below, 0.364 parts by mass of salicylic acid as the component (E) and 0.05 parts by mass of a surfactant "XR-104" (trade name, Manufactured by Dainippon Ink and Chemicals, Inc.) were dissolved in 1,150 parts by mass of propylene glycol monomethylether acetate to prepare a positive resist composition solution.

The resulting positive resist composition solution was uniformly coated on a 8 inch silicone substrate subjected to a hexamethyldisilazane treatment so as to attain the resist film thickness shown in Table 1, followed by subjecting to a prebaking treatment (PAB) at 110° C. for 90 seconds to form a resist film.

After drawing using an electron beam lithography system (manufactured by Hitachi, Ltd., HL-800D, 70 kV accelerating voltage), the substrate was subjected to post exposure baking (PEB) at 110° C. for 90 seconds, developed with an aqueous 2.38 mass % TMAH solution at 23° C. for 60 seconds, rinsed with pure water for 30 seconds, subjected to shake-off drying, and then subjected to a baking treatment at 100° C. for 60 seconds to form a resist pattern having a target line-and-space (line width/space width=1/1) of a line width of 200 nm (hereinafter referred to as a resist pattern of 200 nm).

The resulting resist pattern was observed by a scanning electron microscope (SEM) thereby determining an optimum light exposure (μC/cm$^2$) at which a resist pattern of 200 nm is formed. The results are shown in Table 2 as "sensitivity".

Also, the resist pattern was observed by a scanning electron microscope (SEM) thereby determining critical resolution (nm) in an optimum light exposure critical resolution (nm) at which a resist pattern of 200 nm is formed. The results are shown in Table 2 as "resolution".

The positive resist composition solution obtained above was coated on an 8 inch silicone substrate so as to attain the resist film thickness of 300 nm, followed by PAB at 110° C. for 90 seconds to form a resist film. The substrate was allowed to stand in an electron beam lithography system (manufactured by Hitachi, Ltd., HL-800D, 70 kV accelerating voltage) for 0 hour to 24 hours maximum. After drawing at the same light exposure every 2 hours and PEB at 110° C. for 90 seconds, the substrate was developed with an aqueous 2.38 mass % TMAH solution at 23° C. for 60 seconds, rinsed with pure water for 30 seconds, subjected to shake-off drying and then subjected to post exposure baking at 100° C. for 60 seconds. Thus, plural resist patterns of 200 nm, the standing time in the lithography system being different, were formed on the same substrate. The pressure in the lithography system was 1.8×10$^{-5}$ Pa.

With respect to the resulting resist patterns of 200 nm, dimensional change was calculated in the following manner. The results are shown in Table 2.

Dimensional change (nm)=Line width at which largest change arises−200 nm (among resist patterns thus formed, in the case of comparing the value obtained by subtracting 200 nm from Line width at which largest change arises with the value obtained by subtracting 200 nm from line width at which smallest change arises, the value having a larger absolute value thus obtained)

In Table 2, the positive (+) value shows that the pattern becomes thick, while the negative (−) value shows that the pattern becomes thin.

TABLE 1

|  | Component (A) [Amount (pats by mass)] | | Amine [Amount (parts by mass) | Thickness of resist film (nm) |
|---|---|---|---|---|
| Example 1 | Resin 1 [100] | — | Amine 2 [0.666] | 300 |
| Example 2 | Resin 1 [100] | — | Amine 3 [0.780] | 300 |
| Example 3 | Resin 1 [80] | Resin 5 [20] | Amine 3 [0.780] | 300 |
| Example 4 | Resin 1 [70] | Resin 5 [20] | Amine 3 [0.780] | 300 |
| Comparative Example 1 | Resin 1 [100] | — | Amine 1 [0.96] | 300 |
| Example 5 | Resin 2 [100] | — | Amine 2 [0.666] | 300 |
| Example 6 | Resin 2 [100] | — | Amine 3 [0.780] | 300 |
| Example 7 | Resin 2 [80] | Resin 5 [20] | Amine 3 [0.780] | 300 |
| Example 8 | Resin 2 [70] | Resin 5 [30] | Amine 3 [0.780] | 300 |
| Comparative Example 2 | Resin 2 [100] | — | Amine 2 [0.96] | 300 |
| Example 9 | Resin 3 [100] | — | Amine 2 [0.666] | 300 |

TABLE 1-continued

|  | Component (A) [Amount (pats by mass)] | | Amine [Amount (parts by mass) | Thickness of resist film (nm) |
|---|---|---|---|---|
| Example 10 | Resin 3 [100] | — | Amine 3 [0.780] | 300 |
| Example 11 | Resin3 [80] | Resin 5 [20] | Amine 3 [0.780] | 300 |
| Example 12 | Resin 3 [70] | Resin 5 [30] | Amine 3 [0.780] | 300 |
| Comparative Example 3 | Resin 3 [100] | — | Amine 1 [0.96] | 300 |
| Example 13 | Resin 4 [100] | — | Amine 2 [0.666] | 300 |
| Example 14 | Resin 4 [100] | — | Amine 3 [0.780] | 300 |
| Example 15 | Resin 4 [80] | Resin 5 [20] | Amine 3 [0.780] | 300 |
| Example 16 | Resin 4 [70] | Resin 5 [30] | Amine 3 [0.780] | 300 |
| Comparative Example 4 | Resin 4 [100] | — | Amine 1 [0.96] | 300 |

The structures of the resins 1 to 5 in Table 1 are as shown below.

In Table 1, the amine 1 is tri-n-octylamine, the amine 2 is triphenylamine, and the amine 3 is tribenzylamine. Furthermore, 0.96 parts by mass of the amine 1, 0.666 parts by mass of the amine 2 and 0.78 parts by mass of the amine 3 are equimolar amounts.

[Chemical Formula 20]

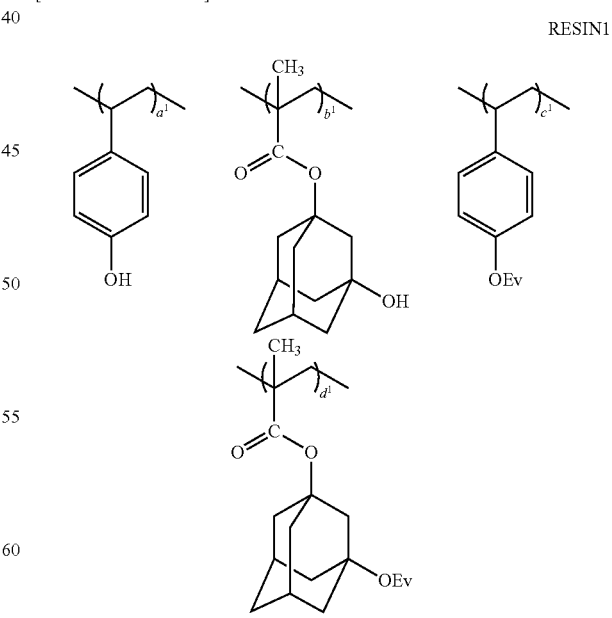

RESIN1 wherein $a^1$:$b^1$:$c^1$:$d^1$ (molar ratio) is 58:17:22:3 (molar ratio), Ev represents 1-ethoxyethyl group, Mw=12,000, and Mw/Mn=1.7

[Chemical Formula 21]

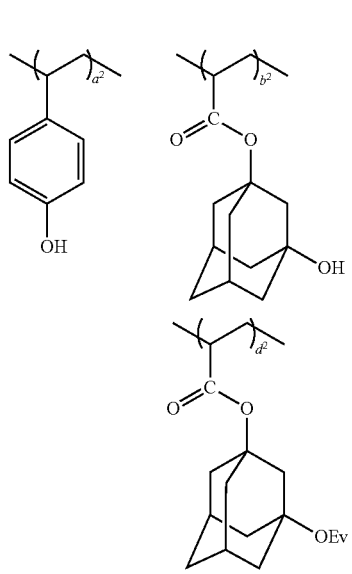

RESIN2 wherein $a^2:b^2:c^2:d^2$ (molar ratio) is 58:17:22:3, Ev represents a 1-ethoxyethyl group, Mw=10000, and Mw/Mn=1.5

[Chemical Formula 22]

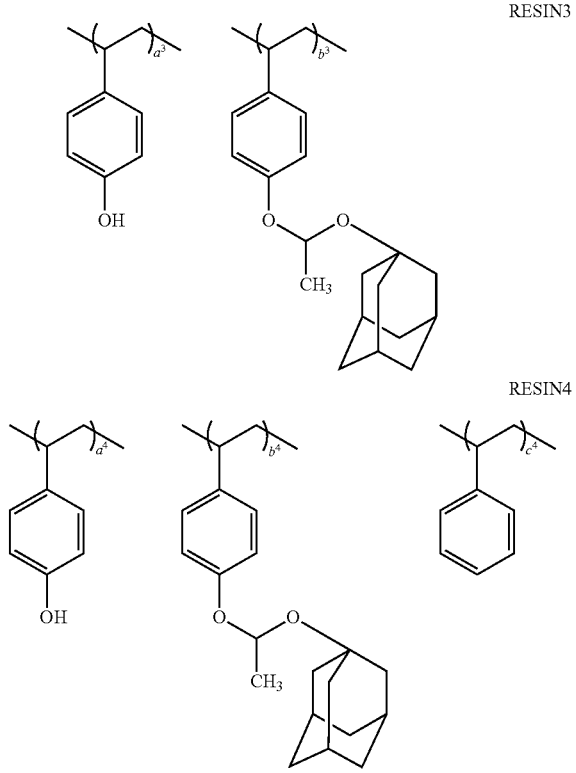

RESIN3

RESIN4 wherein $a^3:b^3$ (molar ratio) is 72:28, Mw=12,000, and Mw/Mn=1.2 in the case of the resin 3; $a^4:b^4:c^4$ (molar ratio) is 62:28:10, Mw=10000, and Mw/Mn 1.2 in the case of the resin 4

[Chemical Formula 23]

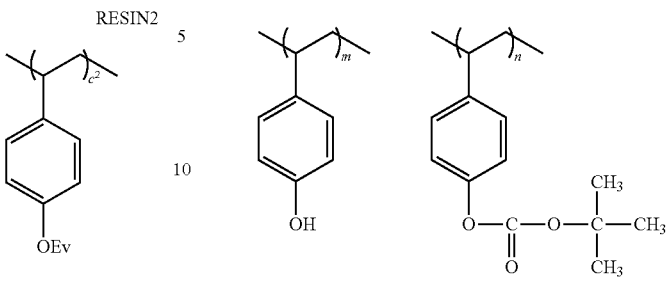

RESIN5 wherein m:n (molar ratio) is 56:44, Mw=12400, and Mw/Mn=1.2

TABLE 2

|  | Sensitivity ($\mu C/cm^2$) | Resolution (nm) | Amount of dimensional change (nm) |
|---|---|---|---|
| Example 1 | <1.0 | 100 | −10.31 |
| Example 2 | 14.3 | 70 | −9.66 |
| Example 3 | 13.0 | 70 | −5.31 |
| Example 4 | 13.0 | 70 | −0.25 |
| Comparative Example 1 | 12.0 | 70 | −15.64 |
| Example 5 | <1.0 | 100 | −10.75 |
| Example 6 | 11.0 | 70 | −8.15 |
| Example 7 | 11.0 | 70 | −4.32 |
| Example 8 | 11.0 | 70 | −0.15 |
| Comparative Example 2 | 10.0 | 70 | −15.83 |
| Example 9 | <1.0 | 100 | −18.15 |
| Example 10 | 9.13 | 70 | −15.31 |
| Example 11 | 9.26 | 70 | −10.13 |
| Example 12 | 9.3 | 70 | −8.75 |
| Comparative Example 3 | 8.13 | 70 | −20.13 |
| Example 13 | <1.0 | 100 | −12.31 |
| Example 14 | 8.8 | 80 | −10.06 |
| Example 15 | 9.0 | 80 | −7.52 |
| Example 16 | 9.0 | 80 | −3.13 |
| Comparative Example 4 | 8.54 | 70 | −16.31 |

As is apparent from the results, it could be confirmed that size controllability was excellent in stability in vacuum because of small dimensional change in Examples 1 to 16. Examples 3 to 4, Examples 7 to 8, Examples 11 to 12 and Examples 15 to 16, wherein both the resin 1, 2, 3 or 4, and the resin 5 are used, showed good results of dimensional change.

Also, the positive resist compositions of Examples 1 to 16 showed sufficiently high resolution, and resolution was particularly excellent when tribenzylamine (amine 3) is used.

On the other hand, the positive resist compositions of Comparative Examples 1 to 4 showed high resolution, but caused large dimensional change and were inferior in size controllability.

Examples and Comparative Examples according to third and fourth aspects of the present invention will now be described.

Examples 17 to 20, Comparative Example 5,
Examples 21 to 24, Comparative Example 6,
Examples 25 to 28, Comparative Example 7,
Examples 29 to 32, Comparative Example 8

100 Parts by mass of the component (A) shown in Table 3, 8 parts by mass of α-(methyloxyimino)-p-methoxyphenylacetonitrile as the component (B), 0.96 parts by mass of tri-n-octylamine as the component (D), 0.364 parts by mass of salicylic acid as the component (E) and 0.05 parts by mass of a surfactant "XR-08" (trade name, Manufactured by Dainippon Ink and Chemicals, Inc.) were dissolved in 1,150 parts by mass of propylene glycol monomethylether acetate to prepare a positive resist composition solution.

The resulting positive resist composition solution was uniformly coated on an 8 inch silicone substrate, on which chromium oxide was laminated, subjected to a hexamethyldisilazane (HMDS) treatment so as to attain the resist film thickness shown in Table 3, followed by subjecting to a pre-baking treatment (PAB) at 110° C. for 90 seconds to form a resist film.

After drawing using an electron beam lithography system (manufactured by Hitachi, Ltd., HL-800D, 70 kV accelerating voltage), the substrate was subjected to post exposure baking (PEB) at 110° C. for 90 seconds, developed with an aqueous 2.38 mass % TMAH solution at 23° C. for 60 seconds, rinsed with pure water for 30 seconds, subjected to shake-off drying, and then subjected to a baking treatment at 100° C. for 60 seconds to form a resist pattern having a target line-and-space (line width/space width=1/1) of a line width of 200 nm (hereinafter referred to as a resist pattern of 200 nm).

The resulting resist pattern was observed by a scanning electron microscope (SEM) thereby determining critical resolution (nm) in an optimum light exposure critical resolution (nm) at which a resist pattern of 200 nm is formed. The results are shown in Table 2 as "resolution".

The positive resist composition solution obtained above was coated on an 8 inch silicone substrate so as to attain the resist film thickness of 300 nm, followed by PAB at 110° C. for 90 seconds to form a resist film. The substrate was allowed to stand in an electron beam lithography system (manufactured by Hitachi, Ltd., HL-800D, 70 kV accelerating voltage) for 0 hour to 24 hours maximum. After drawing at the same light exposure every 2 hours and PEB at 110° C. for 90 seconds, the substrate was developed with an aqueous 2.38 mass % TMAH solution at 23° C. for 60 seconds, rinsed with pure water for 30 seconds, subjected to shake-off drying and then subjected to post exposure baking at 100° C. for 60 seconds. Thus, plural resist patterns of 200 nm, the standing time in the lithography system being different, were formed on the same substrate. The pressure in the lithography system was $1.8 \times 10^{-5}$ Pa.

With respect to the resulting resist patterns of 200 nm, dimensional change was calculated in the following manner. The results are shown in Table 2.

Dimensional change (nm)=Line width at which largest change arises−200 nm (among resist patterns thus formed, in the case of comparing the value obtained by subtracting 200 nm from Line width at which largest change arises with the value obtained by subtracting 200 nm from line width at which smallest change arises, the value having a larger absolute value thus obtained)

In Table 2, the positive (+) value shows that the pattern becomes thick, while the negative (−) value shows that the pattern becomes thin.

TABLE 3

| | Component (A) [Amount (pats by mass)] | | Thickness of resist film (nm) |
|---|---|---|---|
| Example 17 | Resin 1 [80] | Resin 5 [20] | 300 |
| Example 18 | Resin 1 [70] | Resin 5 [30] | 300 |
| Example 19 | Resin 1 [60] | Resin 5 [40] | 300 |
| Example 20 | Resin 1 [20] | Resin 5 [80] | 300 |
| Comparative Example 5 | Resin 1 [100] | — | 300 |
| Example 21 | Resin 2 [80] | Resin 5 [20] | 300 |
| Example 22 | Resin 2 [70] | Resin 5 [30] | 300 |
| Example 23 | Resin 2 [60] | Resin 5 [40] | 300 |
| Example 24 | Resin 2 [20] | Resin 5 [80] | 300 |
| Comparative Example 6 | Resin 2 [100] | — | 300 |
| Example 25 | Resin 3 [80] | Resin 5 [20] | 300 |
| Example 26 | Resin 3 [70] | Resin 5 [30] | 300 |
| Example 27 | Resin 3 [60] | Resin 5 [40] | 300 |
| Example 28 | Resin 3 [20] | Resin 5 [80] | 300 |
| Comparative Example 7 | Resin 3 [100] | — | 300 |
| Example 29 | Resin 4 [80] | Resin 5 [20] | 300 |
| Example 30 | Resin 4 [70] | Resin 5 [30] | 300 |
| Example 31 | Resin 4 [60] | Resin 5 [40] | 300 |
| Example 32 | Resin 4 [20] | Resin 5 [80] | 300 |
| Comparative Example 8 | Resin 4 [100] | — | 300 |

Structures of the resins 1 to 5 in Table 3 are as described above.

TABLE 4

| | Resolution (nm) | Amount of dimensional change (nm) |
|---|---|---|
| Example 17 | 70 | −7.85 |
| Example 18 | 70 | −4.46 |
| Example 19 | 70 | −1.16 |
| Example 20 | 70 | +2.38 |
| Comparative Example 5 | 70 | −15.64 |
| Example 21 | 70 | −7.95 |
| Example 22 | 70 | −4.38 |
| Example 23 | 70 | −1.53 |
| Example 24 | 80 | +3.58 |
| Comparative Example 6 | 70 | −15.30 |
| Example 25 | 80 | −12.16 |
| Example 26 | 80 | −5.14 |
| Example 27 | 80 | −1.53 |
| Example 28 | 80 | +0.93 |
| Comparative Example 7 | 80 | −20.13 |
| Example 29 | 80 | −9.83 |
| Example 30 | 80 | −4.16 |
| Example 31 | 80 | −1.53 |
| Example 32 | 80 | +2.38 |
| Comparative Example 8 | 80 | −17.14 |

As is apparent from the results, it could be confirmed that Examples 17 to 32 showed high resolution and small dimensional change. It could be confirmed that size controllability of the positive resist compositions of Examples 17 to 32 are excellent in stability in vacuum because of small dimensional change. Examples 18 to 20, Examples 22 to 24, Examples 26 to 28 and Examples 30 to 32, wherein the resin 1, 2, 3 or 4, and the resin 5 are used in a ratio within a range from 20/80 to 70/30 (mass ratio), showed particularly good results.

On the other hand, the positive resist compositions of Comparative Examples 5 to 8 showed high resolution, but showed large dimensional change and low stability of size controllability in vacuum.

Examples and Comparative Examples according to fifth and sixth aspects of the present invention will now be described.

Examples 33 to 36, Comparative Example 9, Examples 37 to 40, Comparative Example 10

100 Parts by mass of the component (A) shown in Table 5, 8 parts by mass of α-(methyloxyimino)-p-methoxyphenylacetonitrile as the component (B), 0.96 parts by mass of tri-n-octylamine as the component (D), 0.364 parts by mass of salicylic acid as the component (E) and 0.05 parts by mass of a surfactant "XR-08" (trade name, Manufactured by Dainippon Ink and Chemicals, Inc.) were dissolved in 1,150 parts by mass of propylene glycol monomethylether acetate to prepare a positive resist composition solution.

The resulting positive resist composition solution was uniformly coated on an 8 inch silicone substrate subjected to a hexamethyldisilazane treatment so as to attain the resist film thickness shown in Table 9, followed by subjecting to a pre-baking treatment (PAB) at 110° C. for 90 seconds to form a resist film. After drawing using an electron beam lithography system (manufactured by Hitachi, Ltd., HL-800D, 70 kV accelerating voltage), the substrate was subjected to post exposure baking (PEB) at 110° C. for 90 seconds, developed with an aqueous 2.38 mass % TMAH solution at 23° C. for 60 seconds, rinsed with pure water for 30 seconds, subjected to shake-off drying, and then subjected to a baking treatment at 100° C. for 60 seconds to form a resist pattern having a target line-and-space (line width/space width 1/1) of a line width of 200 nm (hereinafter referred to as a resist pattern of 200 nm).

The resulting resist pattern was observed by a scanning electron microscope (SEM) thereby determining critical resolution (nm) in an optimum light exposure critical resolution (nm) at which a resist pattern of 200 nm is formed. The results are shown in Table 6 as "resolution".

The positive resist composition solution obtained above was coated on an 8 inch silicone substrate so as to attain the resist film thickness of 300 nm, followed by PAB at 110° C. for 90 seconds to form a resist film. The substrate was allowed to stand in an electron beam lithography system (manufactured by Hitachi, Ltd., HL-800D, 70 kV accelerating voltage) for 0 hour to 24 hours maximum. After drawing at the same light exposure every 2 hours and PEB at 110° C. for 90 seconds, the substrate was developed with an aqueous 2.38 mass % TMAH solution at 23° C. for 60 seconds, rinsed with pure water for 30 seconds, subjected to shake-off drying and then subjected to post exposure baking at 100° C. for 60 seconds. Thus, plural resist patterns of 200 nm, the standing time in the lithography system being different, were formed on the same substrate. The pressure in the lithography system was $1.8 \times 10^{-5}$ Pa.

With respect to the resulting resist patterns of 200 nm, dimensional change was calculated in the following manner. The results are shown in Table 6.

Dimensional change (nm)=Line width at which largest change arises−200 nm (among resist patterns thus formed, in the case of comparing the value obtained by subtracting 200 nm from Line width at which largest change arises with the value obtained by subtracting 200 nm from line width at which smallest change arises, the value having a larger absolute value thus obtained)

In Table 6, the positive (+) value shows that the pattern becomes thick, while the negative (−) value shows that the pattern becomes thin.

TABLE 5

| | Component (A) [Amount (pats by mass)] | | Thickness of resist film (nm) |
|---|---|---|---|
| Example 33 | Resin 1 [80] | Resin 5 [20] | 300 |
| Example 34 | Resin 1 [70] | Resin 5 [30] | 300 |
| Example 35 | Resin 1 [60] | Resin 5 [40] | 300 |
| Example 36 | Resin 1 [20] | Resin 5 [80] | 300 |
| Comparative Example 9 | Resin 1 [100] | — | 300 |
| Example 37 | Resin 2 [80] | Resin 5 [20] | 300 |
| Example 38 | Resin 2 [70] | Resin 5 [30] | 300 |
| Example 39 | Resin 2 [60] | Resin 5 [40] | 300 |
| Example 40 | Resin 2 [20] | Resin 5 [80] | 300 |
| Comparative Example 10 | Resin 2 [100] | — | 300 |

Structures of the resins 1, 2 and 5 in Table 5 are as described above.

TABLE 6

| | Resolution (nm) | Amount of dimensional change (nm) |
|---|---|---|
| Example 33 | 70 | −7.85 |
| Example 34 | 70 | −4.46 |
| Example 35 | 70 | −1.16 |
| Example 36 | 70 | +2.38 |
| Comparative Example 9 | 70 | −15.64 |
| Example 37 | 70 | −7.95 |
| Example 38 | 70 | −4.38 |
| Example 39 | 70 | −1.53 |
| Example 40 | 80 | +3.58 |
| Comparative Example 10 | 70 | −15.30 |

As is apparent from the results, it could be confirmed that Examples 33 to 39 showed resolution of 70 nm and small dimensional change. Also, Example 40 showed so high resolution as 80 nm and very small dimensional change. Thus, it could be confirmed that size controllability of the positive resist compositions of Examples 33 to 40 are excellent in stability in vacuum because of very small dimensional change. Examples 34 to 36 and Examples 38 to 40, wherein the resin 1 or 2, and the resin 5 are used in a ratio within a range from 20/80 to 70/30 (mass ratio), showed particularly good results.

On the other hand, the positive resist compositions of Comparative Examples 9 and 10 showed high resolution, but showed large dimensional change and low stability of stability in vacuum.

The invention claimed is:

1. A positive resist composition comprising a resin component (A) comprising an alkali soluble constituent unit (a1) and a constituent unit (a2) having an acid dissociable dissolution inhibiting group in which alkali solubility enhances by an action of an acid, and an acid generator component (B) which generates an acid upon exposure, and tribenzylamine, wherein the resin component (A) comprises a polymer (A11) and a polymer (A21), wherein the polymer (A11) comprises a constituent unit (a11) derived from (α-methyl)hydroxystyrene, a constituent unit (a21) in which hydrogen atoms of a hydroxyl group of the constituent unit (a11) are substituted with an acid dissociable dissolution inhibiting group, no constituent unit derived from an (α-lower alkyl)acrylate ester (a12) having an alcoholic hydroxyl group and no constituent unit (a22) in which hydrogen atoms of an alcoholic hydroxyl group of the constituent unit (a12) are substituted with an acid dissociable dissolution inhibiting group, wherein the constituent unit (a21) has an acid dissociable dissolution inhibiting group (II) represented by the following formula (II) and does not have an acid dissociable dissolution inhibiting group (III) selected from the group consisting of a chain tertiary alkoxycarbonyl group, a chain tertiary alkyl group and a chain tertiary alkoxycarbonylalkyl group, and the polymer (A21) comprises the constituent unit (a11), the constituent unit (a21), no constituent unit (a12) and no constituent unit (a22), wherein the constituent unit (a21) has the acid dissociable dissolution inhibiting group (III) and does not have the acid dissociable dissolution inhibiting group (II):

[Chemical Formula 1]

(II)

wherein X represents an adamantyl group or a naphthyl group, $R^1$ represents an alkyl group having 1 to 5 carbon atoms, and $R^2$ represents an alkyl group having 1 to 5 carbon atoms or a hydrogen atom, wherein the acid generator component (B) is selected from the group consisting of an onium salt-based acid generator, oxime sulfonate-based acid generator, nitrobenzylsulfonate-based acid generator, iminosulfonate-based acid generator and disulfone-based acid generator.

2. The positive resist composition according to claim 1, wherein a ratio (mass ratio) of the polymer (A1) to the polymer (A2) is within a range from 10/90 to 90/10.

3. The positive resist composition according to claim 1, wherein the polymer (A11) further comprises a constituent unit (a3) derived from α-methyl)styrene.

4. A positive resist composition comprising a resin component (A) comprising an alkali soluble constituent unit (a1) and a constituent unit (a2) having an acid dissociable dissolution inhibiting group in which alkali solubility enhances by an action of an acid, and an acid generator component (B) which generates an acid upon exposure, and an aromatic amine (C), wherein the resin component (A) comprises a polymer (A12) and a polymer (A21), wherein the polymer (A12) comprises at least one of a constituent unit (a11) derived from (α-methyl)hydroxystyrene, a constituent unit (a21) in which hydrogen atoms of a hydroxyl group of the constituent unit (a11) are substituted with an acid dissociable dissolution inhibiting group, a constituent unit (a12) represented by general formula (IV) below and a constituent unit (a22) in which hydrogen atoms or an alcoholic hydroxyl group of the constituent unit (a12) represented by general formula (IV) are substituted with an acid dissociable dissolution inhibiting group, wherein the constituent unit (a21) has an acid dissociable dissolution inhibiting group (II) represented by the following formula (II) and does not have an acid dissociable dissolution inhibiting group (III) selected from the group consisting of a chain tertiary alkoxycarbonyl group, a chain tertiary alkyl group and a chain tertiary alkoxycarbonylalkyl group, and the polymer (A21) comprises the constituent unit (a11), the constituent unit (a21), no constituent unit (a12) and no constituent unit (a22), wherein the constituent unit (a21) has the acid dissociable dissolution inhibiting group (III) and does not have the acid dissociable dissolution inhibiting group (II):

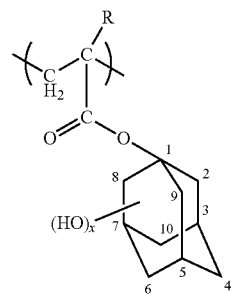

(IV)

wherein R represents a hydrogen atom or a lower alkyl group, and x represents an integer of 1 to 3,

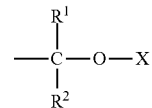

(II)

wherein X represents an aliphatic cyclic group, an aromatic cyclic hydrocarbon group or an alkyl group having 1 to 5 carbon atoms, $R^1$ represents an alkyl group having 1 to 5 carbon atoms, or X and $R^1$ each independently represents an alkylene group having 1 to 5 carbon atoms and the end of X is bonded with the end of $R^1$, and $R^2$ represents an alkyl group having 1 to 5 carbon atoms or a hydrogen atom, and/or at least one acid dissociable dissolution inhibiting group (III) selected from the group consisting of a chain tertiary alkoxycarbonyl group, a chain tertiary alkyl group and a chain tertiary alkoxycarbonylalkyl group, wherein the acid generator component (B) is selected from the group consisting of an onium salt-based acid generator, oxime sulfonate-based acid generator, nitrobenzylsulfonate-based acid generator, iminosulfonate-based acid generator and disulfone-based acid generator.

5. The positive resist composition according to claim 4, wherein the acid dissociable dissolution inhibiting group (II) is a 1-alkoxyalkyl group in the polymer (A12).

6. A positive resist composition comprising a resin component (A) comprising an alkali soluble constituent unit (a1) and a constituent unit (a2) having an acid dissociable dissolution inhibiting group in which alkali solubility enhances by an action of an acid, and an acid generator component (B) which generates an acid upon exposure, wherein the resin component (A) comprises a polymer (A1) and a polymer (A2), the polymer (A1) comprises at least one of a constituent unit (a11) derived from α-methyl)hydroxystyrene, a constituent unit (a21) in which hydrogen atoms of a hydroxl group of the constituent unit (a11) are substituted with an acid dissociable dissolution inhibiting group, a constituent unit (a12) represented by general formula (IV) below and a constituent unit (a22) in which hydrogen atoms of an alcoholic hydroxyl group of the constituent unit (a12) represented by general formula (IV) are substituted with an acid dissociable dissolution inhibiting group, wherein the constituent unit (a21) has an acid dissociable dissolution inhibiting group (II) represented by the following formula (II) and does not have an acid dissociable dissolution inhibiting group (III) selected from the group consisting of a chain tertiary alkoxycarbonyl group, a chain tertiary alkyl group and a chain tertiary alkoxycarbonylalkyl group, and the polymer (A2) comprises the constituent unit (a11), the constituent unit (a21), no constituent unit (a12) and no constituent unit (a22), wherein the constituent unit (a21) has the acid dissociable dissolution inhibiting group (III) and does not have the acid dissociable dissolution inhibiting group (II):

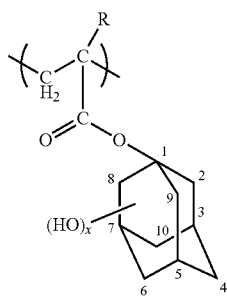

wherein R represents a hydrogen atom or a lower alkyl group, and x represents an integer of 1 to 3,

[Chemical Formula 5]

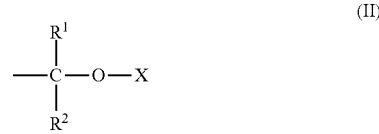

wherein X represents an aliphatic cyclic group, an aromatic cyclic hydrocarbon group or an alkyl group having 1 to 5 carbon atoms, $R^1$ represents an alkyl group having 1 to 5 carbon atoms, or X and $R^1$ each independently represents an alkylene group having 1 to 5 carbon atoms and the end of X is bonded with the end of $R^1$, and $R^2$ represents an alkyl group having 1 to 5 carbon atoms on a hydrogen atom, and at least one acid dissociable dissolution inhibiting group (III) selected from the group consisting of a chain tertiary alkoxycarbonyl group, a chain tertiary alkyl group and a chain tertiary alkoxycarbonylalkyl group, wherein the acid generator component (B) is selected from the group consisting of an onium salt-based acid generator, oxime sulfonate-based acid generator, nitrobenzylsulfonate-based acid generator, iminosulfonate-based acid generator and disulfone-based acid generator.

7. The positive resist composition according to claim 6, wherein a ratio (mass ratio) of the content of the polymer (A1) to that of the polymer (A2) is within a range from 10/90 to 90/10.

8. The positive resist composition according to claim 6, wherein the proportion of the constituent unit (a21) based on the total proportion of the entire constituent unit constituting the polymer (A2) is from 30 to 50 mol %.

9. The positive resist composition according to claim 4, wherein the aromatic amine (C) comprises compounds represented by following general formula (c-1):

[Chemical Formula 19]

wherein $R^{11}$ to $R^{13}$ each independently represents a hydrogen atom, an alkyl group having 1 to 10 carbon atoms or an aromatic hydrocarbon group, and at least one of $R^{11}$ to $R^{13}$ represents an aromatic hydrocarbon group.

* * * * *

UNITED STATES PATENT AND TRADEMARK OFFICE
CERTIFICATE OF CORRECTION

| | |
|---|---|
| PATENT NO. | : 8,062,825 B2 |
| APPLICATION NO. | : 11/719179 |
| DATED | : November 22, 2011 |
| INVENTOR(S) | : Tomoyuki Ando and Takako Hirosaki |

Page 1 of 2

It is certified that error appears in the above-identified patent and that said Letters Patent is hereby corrected as shown below:

At Page 1, Column 2, Under "Foreign Patent Documents," delete "JP2004433549 11/2004".

At Column 1, Line 45, Change "mm)" to --nm)--.

At Column 3, Line 44, Change "α-methyl)hydroxystyrene," to --(α-methyl)hydroxystyrene,--.

At Column 3, Line 67, Change "α-methyl)hydroxystyrene" to --(α-methyl)hydroxystyrene--.

At Column 5, Line 2, Change "α-methyl)hydroxystyrene" to --(α-methyl)hydroxystyrene--.

At column 5, Line 5, Change "α-methyl)hydroxystyrene." to --(α-methyl)hydroxystyrene.--.

At Column 5, Lines 65-66, Change "(α-lower alkylacrylate" to --(α-lower alkyl)acrylate--.

At Column 10, Line 20 (Approx.), Change "units" to --units.--.

At Column 12, Line 31, Change "(a2)," to --(a12),--.

At Column 12, Line 67, Change "(III))" to --(III)).--.

At Column 13, Line 5, Change "(III))" to --(III)).--.

At Column 13, Line 11, Change "(II))" to --(II)).--.

At Column 13, Line 33, Change "(A 1)." to --(A11).--.

At Column 14, Line 44, Change "(a11)," to --(a21),--.

At Column 18, Line 52, Change "thereof" to --thereof,--.

At Column 18, Lines 64-65, Change "rifluoromethanesulfonate" to --trifluoromethanesulfonate--.

At Column 20, Line 46, Change "alkyl" to --alkyl,--.

At Column 30, Line 22, Change "triphenethylamin." to --triphenethylamine.--.

At Column 35, Line 39 (Approx.), Change "obtained)" to --obtained).--.

At Column 39, Line 64, Change "obtained)" to --obtained).--.

At Column 42, Line 7, Change "obtained)" to --obtained).--.

At Column 43, Line 58, In Claim 3, change "α-methyl)styrene." to --(α-methyl)styrene.--.

Signed and Sealed this
Eighth Day of May, 2012

David J. Kappos
*Director of the United States Patent and Trademark Office*

CERTIFICATE OF CORRECTION (continued)
U.S. Pat. No. 8,062,825 B2

At Column 44, Line 8 (Approx.), In Claim 4, change "or" to --of--.

At Column 45, Lines 9-10 (Approx.), In Claim 6, change "α-methyl)hydroxystyrene," to --(α-methyl)hydroxystyrene,--.

At Column 45, Line 12 (Approx.), In Claim 6, change "hydroxl" to --hydroxyl--.

At Column 46, Line 16, In Claim 6, change "on" to --or--.